United States Patent
Kimmel et al.

(10) Patent No.: US 7,945,822 B1
(45) Date of Patent: May 17, 2011

(54) STORING DATA TO MULTI-CHIP LOW-LATENCY RANDOM READ MEMORY DEVICE USING NON-ALIGNED STRIPING

(75) Inventors: Jeffrey S. Kimmel, Chapel Hill, NC (US); Rajesh Sundaram, Mountain View, CA (US); George Totolos, Jr., Cranberry Township, PA (US); Michael W. J. Hordijk, Mars, PA (US)

(73) Assignee: NetApp, Inc., Sunnyvale, CA (US)

( * ) Notice: Subject to any disclaimer, the term of this patent is extended or adjusted under 35 U.S.C. 154(b) by 193 days.

(21) Appl. No.: 12/430,783

(22) Filed: Apr. 27, 2009

(51) Int. Cl.
*G11C 29/00* (2006.01)

(52) U.S. Cl. .......... 714/710; 714/2; 714/3; 714/5; 714/7; 714/8; 714/42; 714/718; 714/723; 714/742; 365/185.01; 365/185.09; 365/200; 365/201

(58) Field of Classification Search .......... None
See application file for complete search history.

(56) References Cited

U.S. PATENT DOCUMENTS

| | | | |
|---|---|---|---|
| 2005/0270866 A1* | 12/2005 | Ouellette et al. | 365/200 |
| 2007/0159897 A1* | 7/2007 | Wang | 365/200 |
| 2009/0083504 A1* | 3/2009 | Belluomini et al. | 711/162 |
| 2009/0083591 A1* | 3/2009 | Brune et al. | 714/718 |
| 2009/0182790 A1* | 7/2009 | Hluchyj et al. | 707/205 |
| 2009/0182939 A1* | 7/2009 | Hluchyj et al. | 711/114 |
| 2010/0088579 A1* | 4/2010 | Hafner et al. | 714/807 |

OTHER PUBLICATIONS

Eran Gal and Sivan Toledo, Algorithms and Data Structures for Flash Memories, ACM Computing Surveys (CSUR) Archive, Jun. 2005, pp. 138-163, vol. 37, Issue 2, Publisher ACM, New York City, NY, USA.

* cited by examiner

*Primary Examiner* — John P Trimmings
(74) *Attorney, Agent, or Firm* — Stattler-Suh PC

(57) ABSTRACT

Described herein are method and apparatus for storing data to a low-latency random read memory (LLRRM) device using non-aligned data striping, the LLRRM device being implemented on a storage system. The LLRRM device may comprise a bank comprising a plurality of memory chips, each chip being simultaneously accessible for storing data on a plurality of erase-units (EUs). A storage operating system may maintain, for each chip, a reserve data structure listing reserve EUs and a remapping data structure for tracking remappings between defective EUs to reserve EUs in the chip. A defective EU in a chip may be mapped to a reserve EU from the reserve data structure. Upon receiving a data block to be stored to the LLRRM device at the defective EU, the storage operating system may stripe the received data block across a plurality of chips in a non-aligned manner using the remapped reserve EU.

22 Claims, 15 Drawing Sheets

STORING DATA TO MULTI-CHIP LOW-LATENCY RANDOM READ MEMORY DEVICE USING NON-ALIGNED STRIPING

FIELD OF THE INVENTION

The present invention relates to storage systems, and particularly, to storing data to a multi-chip low-latency random read memory device using non-aligned striping.

BACKGROUND OF THE INVENTION

A storage system is a processing system adapted to store and retrieve data on storage devices (such as disks). The storage system includes a storage operating system that implements a file system to logically organize the data as a hierarchical structure of directories and files on the storage devices. Each file may be implemented as a set of blocks configured to store data (such as text), whereas each directory may be implemented as a specially-formatted file in which data about other files and directories are stored. The storage operating system may assign/associate a unique storage system address (e.g., logical block number (LBN)) for each data block stored in the storage system.

The storage operating system generally refers to the computer-executable code operable on a storage system that manages data access and access requests (read or write requests requiring input/output operations) and may implement file system semantics in implementations involving storage systems. In this sense, the Data ONTAP® storage operating system, available from NetApp, Inc. of Sunnyvale, Calif., which implements a Write Anywhere File Layout (WAFL®) file system, is an example of such a storage operating system implemented as a microkernel within an overall protocol stack and associated storage. The storage operating system can also be implemented as an application program operating over a general-purpose operating system, such as UNIX® or Windows®, or as a general-purpose operating system with configurable functionality, which is configured for storage applications as described herein.

A storage system's storage is typically implemented as one or more storage volumes that comprise physical storage devices, defining an overall logical arrangement of storage space. Available storage system implementations can serve a large number of discrete volumes. A storage volume is "loaded" in the storage system by copying the logical organization of the volume's files, data, and directories, into the storage system's memory. Once a volume has been loaded in memory, the volume may be "mounted" by one or more users, applications, devices, and the like, that are permitted to access its contents and navigate its namespace.

A storage system may be configured to allow server systems to access its contents, for example, to read or write data to the storage system. A server system may execute an application that "connects" to the storage system over a computer network, such as a shared local area network (LAN), wide area network (WAN), or virtual private network (VPN) implemented over a public network such as the Internet. The application executing on the server system may send an access request (read or write request) to the storage system for accessing particular data stored on the storage system.

The storage system may typically implement large capacity disk devices for storing large amounts of data. In conjunction with the large capacity disk devices, the storage system may also store data on other storage devices, such as low-latency random read memory (referred to herein as "LLRRM"). When using LLRRM devices in conjunction with disk devices to store data, the storage system may map storage system addresses (e.g., LBNs) to LLRRM addresses to access data on the LLRRM devices. As densities of LLRRM devices (e.g., flash memory) increase to provide larger storage capacities (while prices of LLRRM devices continue to decrease), LLRRM devices are being integrated into applications demanding such higher capacities.

Typically, large capacity LLRRM devices incorporate multiple banks of discrete memory devices, each bank being simultaneously accessible in parallel. At the same time, the multiple banks are also typically concatenated or otherwise organized to operate as a single memory device of greater capacity. Each bank may also comprise a plurality of memory chips, each chip also being simultaneously accessible in parallel. Each chip may also comprise a plurality of erase units, each erase unit (EU) comprising a plurality of pages for storing data. A page may comprise the smallest data unit that can be read or written on the chip. The EU may comprise the smallest data unit that can be erased on the chip, whereby the entire EU may need to be erased before re-writing to any page in the EU.

To reduce latency in accessing data on the LLRRM device, received data blocks to be stored to the LLRRM device may be striped across several chips of the same bank. In data striping, a received data block may be sub-divided into data sub-blocks and the data sub-blocks stored to the multiple chips of the same bank for maximizing use of the parallel accessibility feature of the chips to produce faster read and write times. Conventionally, data is striped using "aligned" stripes, whereby the data sub-blocks of a received data block are stored to the same EUs number and the same page number of each chip in the same bank. This may simplify and reduce the mapping data needed to map the storage system addresses (e.g., LBNs) to the LLRRM address where the received data block may be read from on the LLRRM device. For example, to later read the data block from the LLRRM device, the mapping data may only comprise a single bank number, a single EU number, a single page number, and a single page offset number, (since the EU, page, and offset numbers will be the same for each chip).

However, use of "aligned" data striping may cause a faster rate of reduction in the useable storage capacity of the LLRRM device. When a defective EU (i.e., an EU that no longer performs erase, write, or read operations) is detected in a chip of the LLRRM device, to maintain aligned data striping, the entire row of EUs across the remaining chips may also be declared defective (the row of EUs comprising EUs in the remaining chips having the same EU number as the defective EU). The EUs in the remaining chips may be declared defective (and no longer be used to store data) even though they are in fact functional to maintain the aligned stripes needed in conventional data striping. Over time as more defective EUs are detected and more rows of EUs are declared defective, the useable storage capacity of the LLRRM device may be significantly reduced.

SUMMARY OF THE INVENTION

Described herein are method and apparatus for storing data to a multi-chip low-latency random read memory (LLRRM) device using non-aligned data striping, the LLRRM device being implemented on a storage system. The LLRRM device may comprise at least one memory bank comprising a plurality of memory chips, each chip being simultaneously accessible for storing data. The storage operating system may maintain, for each chip, a reserve data structure for listing reserve EUs in the chip and an EU remapping data structure for storing remapping data of remappings between defective EUs to reserve EUs in the chip.

Upon determining a defective EU in a chip, the storage operating system may not declare the row of corresponding EUs on the remaining chips as defective, but rather, may select a reserve EU from the reserve data structure for the chip and remap the defective EU to the reserve EU (by updating the EU remapping data structure for the chip to reflect the remapping). Upon receiving a data block to be stored to the LLRRM device at the defective EU, the storage operating system may stripe the received data block across a plurality of chips in a non-aligned manner using the remapped reserve EU. As such, data striping across multiple chips may still be maintained while reducing the loss of useable storage capacity in the LLRRM device (caused by declaring rows of corresponding EUs on the remaining chips as defective).

The reserve data structure for each chip lists reserve EUs that may not contain useful client data. These reserve EUs may be considered unavailable for storing client data until they replace (through remapping) a defective EU. Different techniques may be used to determine which EUs of a chip are placed on the reserve EU list in the reserve data structure for each chip. Note that since the reserve EUs do not store useful client data until they replace a defective EU, the storage space of the reserve EUs may typically not be counted towards the total useable storage capacity of the LLRRM device. As such, the manner of reserving EUs for the chips may consider this reduction of the total useable storage capacity of the LLRRM device.

In some embodiments, reserve EUs listed on the reserve data structures may be pre-determined prior to operation of the LLRRM device. In these embodiments, the storage operating system may set aside a predetermined set of one or more EUs in each chip (for listing in the reserve data structure) for later replacing (through remapping) defective EUs in the chip. For example, X % of EUs (e.g., the first or last X % of EUs, etc.) of each chip may be listed as reserve EUs in the reserve data structure for each chip. Since the number of reserve EUs are predetermined prior to operation of the LLRRM device, the total useable storage capacity may also be determined prior to operation of the LLRRM device and some assurances of the total useable storage capacity of the LLRRM device may be given to the storage system. As such, in these embodiments, the LLRRM device may be used as a permanent storage device. In other embodiments, however, the LLRRM device may also be used for purposes not requiring assurances of the total useable storage capacity and where the total useable storage capacity may be variable (such as caching, thin provisioning, data de-duplication, data compression, data cloning, etc.). In some embodiments, the LLRRM device may be used for purposes allowing variable capacity (referred to herein as variable capacity devices), for example, as a cache-type device (e.g., as a main or victim cache).

In other embodiments, reserve EUs listed on the reserve data structure are determined dynamically during operation of the LLRRM device. In these embodiments, prior to operation of the LLRRM device, the storage operating system may not list any reserve EUs in the reserve data structure of each chip (or lists only a nominal number of reserve EUs) and adds reserve EUs to the reserve data structures as defective EUs are detected and defective EUs are declared during operation of the LLRRM device. In these embodiments, when a first defective EU is detected on a chip, the storage operating system may declare the row of corresponding EUs on the remaining chips of the same bank as defective. Each declared defective EU of a chip is then added to the reserve data structure of the chip. When a next defective EU is detected on a chip, the storage operating system may first determine if the chip has a reserve EU listed in the reserve data structure. If not, the storage operating system may declare the row of corresponding EUs on the remaining chips of the same bank as defective as before. If there is a reserve EU for the chip, however, the storage operating system may remap the defective EU to the reserve EU, as described above.

In these embodiments, since EUs are not predetermined, the storage capacity of the LLRRM device is not already reduced at the outset prior to operation of the LLRRM device, and is only reduced when defective EUs are actually detected. In these embodiments, since the number of reserve EUs may increase dynamically during operation of the LLRRM device (thus continuing to reduce its total useable storage capacity), assurances of the total useable storage capacity of the LLRRM may not be given (although assurance of a certain minimum storage capacity may be given). As such, in these embodiments, the LLRRM device may be used as a variable capacity devices for purposes allowing variable capacity, for example, as a cache-type device (e.g., as a main or victim cache).

DETAILED DESCRIPTION

In the following description, numerous details are set forth for purpose of explanation. However, one of ordinary skill in the art will realize that the embodiments described herein may be practiced without the use of these specific details. In other instances, well-known structures and devices are shown in block diagram form in order not to obscure the description with unnecessary detail.

The description that follows is divided into three sections. Section I describes a storage system environment in which some embodiments operate. Section II describes a storage operating system having a non-aligned striping module for using LLRRM as a storage device in a storage system. Section III describes performing non-aligned striping on an LLRRM device.

I. Storage System Environment

Figure 1:
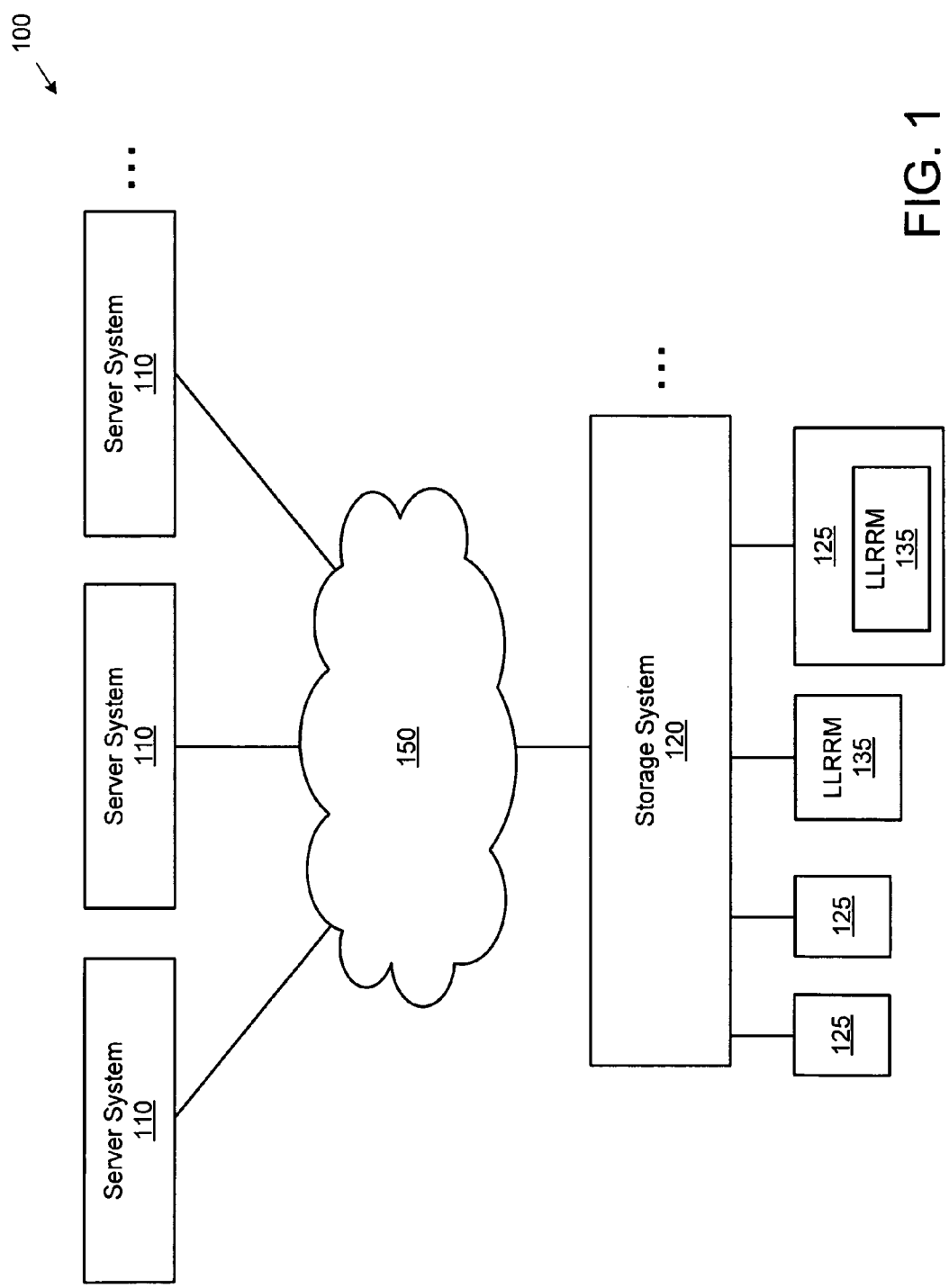
FIG. 1 is a schematic block diagram of an exemplary storage system environment in which some embodiments operate.

FIG. 1 is a schematic block diagram of an exemplary storage system environment 100 in which some embodiments operate. The environment 100 comprises a one or more server systems 110 and a storage system 120 that are connected via a connection system 150. The storage system 120 may comprise a set of storage devices, such as one or more primary storage devices 125 and/or one or more secondary storage devices 135. The connection system 150 may comprise a network, such as a Local Area Network (LAN), Wide Area Network (WAN), metropolitan area network (MAN), the Internet, or any other type of network or communication system between computer systems.

A server system 110 may comprise a computer system that utilizes services of the storage system 120 to store and manage data in the storage devices of the storage system 120. As such, in some embodiments, the server system 110 may also be referred to as a client system that utilizes services of the storage system 120. A server system 110 may execute one or more client applications that submit access requests for accessing particular data on the storage devices 125 and/or 135 of the storage system 120. Interaction between a server system 110 and the storage system 120 can enable the provision of storage services. That is, server system 110 may request the services of the storage system 120 (e.g., through read or write requests), and the storage system 120 may return the results of the services requested by the server system 110, by exchanging packets over the connection system 150. In particular, the server system 110 may submit write requests to the storage system 120, the write requests containing client data (e.g., received from client applications) to be stored on the storage devices 125 and/or 135 of the storage system 120.

The server system 110 may request the services of the storage system by issuing packets using file-based access protocols, such as the Common Internet File System (CIFS) protocol or Network File System (NFS) protocol, over the Transmission Control Protocol/Internet Protocol (TCP/IP) when accessing information in the form of files and directories. Alternatively, the server system 110 may issue packets including block-based access protocols, such as the Fibre Channel Protocol (FCP), or Internet Small Computer System Interface (iSCSI) Storage Area Network (SAN) access, when accessing information in the form of blocks.

The storage system 120 may comprise a computer system that stores client data in a set of one or more primary storage devices 125. A primary storage device 125 may comprise a writable storage device media, such as magnetic disks, video tape, optical, DVD, magnetic tape, and any other similar media adapted to store information (including data and parity information). For illustrative purposes, the primary storage device 125 is sometimes described herein as a disk. In some embodiments, the storage system 120 also stores client data in a set of one or more secondary storage devices 135, a secondary storage device 135 comprising an LLRRM device. The storage system 120 may use the LLRRM devices 135 in conjunction with the primary storage devices 125 to store data. In other embodiments, the storage system 120 may use only the LLRRM devices 135 to store data without use of the primary storage devices 125.

The LLRRM device may comprise a separate (stand-alone) storage device 135 or may be integrated as part of a primary storage device 125 (such as a hybrid drive comprising an LLRRM and a magnetic storage combined in a single device). As discussed below in relation to FIG. 2, an LLRRM device may also reside in the storage system's internal architecture and be connected with the system bus (e.g., as an LLRRM module on a card). The storage system may utilize the LLRRM in a similar manner, regardless of the configuration or location of the LLRRM, so that the LLRRM device(s) 135 and/or primary storage device(s) 125 operate together in a way that is transparent to client applications accessing data stored on the storage system 120.

When implementing one or more LLRRM devices 135 for storing data, the storage system 120 may map storage system addresses to LLRRM addresses for locating and accessing data stored on the LLRRM devices 135 (e.g., using an LLRRM mapping layer 275). The storage system may implement any variety of mapping methods known in the art to do so. The storage system addresses may be used by the file system to locate and access data blocks of the file system, whereas LLRRM addresses may be used by the LLRRM devices 135 to locate and access data blocks stored on the LLRRM devices 135. The LLRRM devices 135 may receive LLRRM addresses and access data on the LLRRM devices 135 by implementing a sub-system for performing various input/output operations (such as reading, writing, or erasing data). The sub-system may comprise a device driver, file system, and/or other software layers for performing the various input/output operations. In some embodiments, an LLRRM device 135 may be used as a permanent storage device (alone or in conjunction with primary storage devices 125). In other embodiments, an LLRRM device 135 may also be used as a variable capacity device (e.g., as a cache-type device, such as a main cache or victim cache).

Although LLRRM may be more costly (for a given amount of data storage) than disk devices, data may be accessed on an LLRRM with higher performance (e.g., lower power consumption and/or lower latency) than on disk devices. In some embodiments, an LLRRM comprises a non-volatile, rewritable computer memory (i.e., a computer memory that does not require power to maintain information stored in the computer memory and may be electrically erased and reprogrammed) having lower latency in performing random-read requests relative to disk devices. As known in the art, a disk device comprises mechanical moving components for reading and writing data (such as platters and the read/write head). In some embodiments, an LLRRM device comprises a non-volatile rewritable solid state memory device having no mechanical moving parts for reading and writing data. Some examples of LLRRM devices include flash memory, non-volatile random access memory (NVRAM), Magnetic Random Access Memory (MRAM), Phase Change RAM (PRAM), etc. In other embodiments, other LLRRM devices are used other than those listed here.

The storage system 120 may implement a file system to logically organize the data as a hierarchical structure of directories and files on each primary and secondary storage device 125 and 135. Each file may be implemented as a set of blocks configured to store data, whereas each directory may be implemented as a specially-formatted file in which information about other files and directories are stored. A block of a file may comprise a fixed-sized amount of data that comprises the smallest amount of storage space that may be accessed (read or written) on a storage device 125. The block may vary widely in data size (e.g., 1 byte, 4-kilobytes (KB), 8 KB, etc.).

The storage operating system may assign/associate a unique storage system address (e.g., logical block number (LBN)) for each data block stored in the storage system. The unique storage system address for a data block may be used by the storage operating system to locate and access (read/write) the data block. In some embodiments, the unique storage system address is referred to as a logical block number (LBN) or a logical block address (LBA). In other embodiments, the storage system address may be expressed in any variety of forms (e.g., logical volume block number, etc.), as long as the storage system address uniquely identifies an address of a data block.

Figure 2:
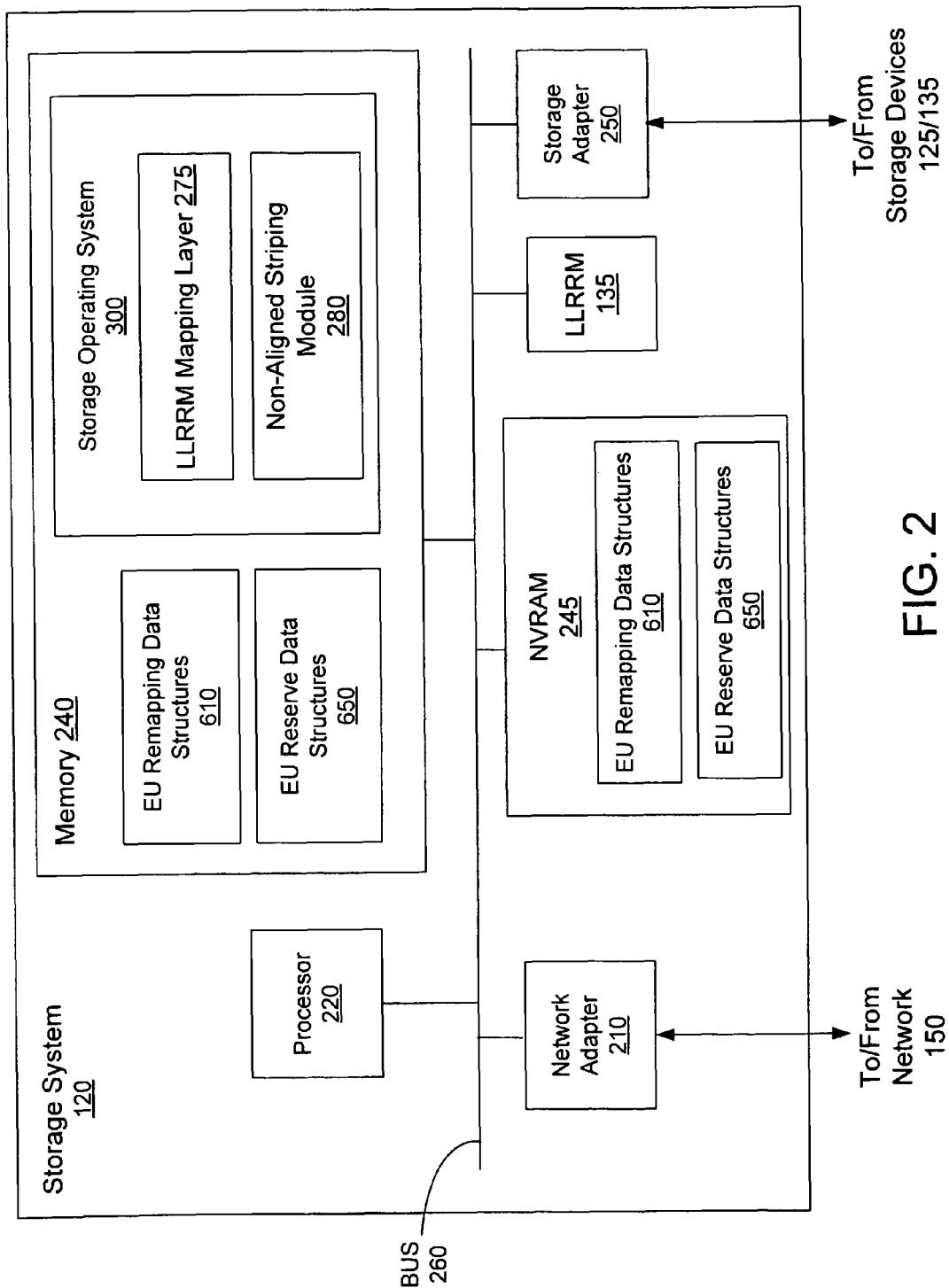
FIG. 2 is a schematic block diagram of an exemplary storage system that may be employed in the storage system environment of FIG. 1.

FIG. 2 is a schematic block diagram of an exemplary storage system 120 that may be employed in the storage system environment of FIG. 1. Those skilled in the art will understand that the embodiments described herein may apply to any type of special-purpose computer (e.g., storage system) or general-purpose computer, including a standalone computer, embodied or not embodied as a storage system. To that end, storage system 120 can be broadly, and alternatively, referred to as a computer system. Moreover, the teachings of the embodiments described herein can be adapted to a variety of storage system architectures including, but not limited to, a network-attached storage environment, a storage area network and disk assembly directly-attached to a server computer. The term "storage system" should, therefore, be taken broadly to include such arrangements.

The storage system 120 comprises a network adapter 210, a processor 220, a memory 240, a non-volatile random access memory (NVRAM) 245, and a storage adapter 250 interconnected by a system bus 260. In some embodiments, the storage system 120 further comprises an LLRRM device 135 that resides in the storage system's internal architecture and is connected with the system bus 260. For example, the LLRRM device 135 may be an LLRRM module on a Peripheral Component Interconnect (PCI) or PCI eXtended (PCI-X) card that is connected with the system bus 260.

The network adapter 210 comprises the mechanical, electrical and signaling circuitry needed to connect the storage system 120 to a server system 110 over a computer network 150. The storage system may include one or more network adapters. Each network adapter 210 has a unique IP address and may provide one or more data access ports for server systems 110 to access the storage system 120 (where the network adapter accepts read/write access requests from the server systems 110 in the form of data packets).

The memory 240 comprises storage locations that are addressable by the processor 220 and adapters for storing software program code and data. The memory 240 may comprise a form of random access memory (RAM) that is generally cleared by a power cycle or other reboot operation (e.g., it is a "volatile" memory). In other embodiments, however, the memory 240 may comprise a non-volatile form of memory that does not require power to maintain information. The processor 220 and adapters may, in turn, comprise processing elements and/or logic circuitry configured to execute the software code and manipulate the data stored in the memory 240.

The storage system 120 may also include a NVRAM 245 that may be employed as a backup memory that ensures that the storage system 120 does not "lose" received information, e.g., CIFS and NFS requests, in the event of a system shutdown or other unforeseen problem. The NVRAM 245 is typically a large-volume solid-state memory array (RAM) having either a back-up battery, or other built-in last-state-retention capabilities (e.g. an LLRRM), that holds the last state of the memory in the event of any power loss to the array. Therefore, even if an access request stored in memory 240 is lost or erased (e.g., due to a temporary power outage) it still may be recovered from the NVRAM 245. In other embodiments, in place of NVRAM 245, the storage system 120 may include any other type of non-volatile memory (such as flash memory, Magnetic Random Access Memory (MRAM), Phase Change RAM (PRAM), etc.).

The processor 220 executes a storage operating system application 300 of the storage system 120 that functionally organizes the storage system by, inter alia, invoking storage operations in support of a file service implemented by the storage system. In some embodiments, the storage operating system 300 comprises a plurality of software layers (including an LLRRM mapping layer 275 and a non-aligned striping module 280) that are executed by the processor 220. In some embodiments, the LLRRM mapping layer 275 and the non-aligned striping module 280 may reside in the storage operating system 300. In some embodiments, the LLRRM mapping layer 275 is implemented to map storage system addresses (e.g., LBNs) to LLRRM addresses to use an LLRRM device as a storage device 135. The LLRRM mapping layer 275 may do so using methods known in the art.

In some embodiments, the storage operating system 300, as well as any layers or modules of the storage operating system 300 (such as the LLRRM mapping layer 275 and the non-aligned striping module 280) may comprise an engine comprising firmware or software and hardware configured to perform embodiments described herein. In general, functions of a software module or software layer described herein may be embodied directly in hardware, or embodied as software executed by a processor, or embodied as a combination of the two.

In some embodiments, the non-aligned striping module 280 works in conjunction with the LLRRM mapping layer 275 to perform non-aligned striping methods described herein. For performing non-aligned striping, the non-aligned striping module 280 produce and maintain erase-unit (EU) EU remapping data structures 610 and erase-unit (EU) reserve data structures 650. The data structures may be stored in memory 240 and/or NVRAM 245. The non-aligned striping module 280 may be pre-included in storage operating system software or comprise an external auxiliary plug-in type software module that works with the storage operating system to enhance its functions. Portions of the storage operating system 300 are typically resident in memory 240. It will be apparent to those skilled in the art, however, that other processing and memory means, including various computer readable media, may be used for storing and executing program instructions pertaining to the storage operating system 300.

The storage adapter 250 cooperates with the storage operating system 300 executing on the storage system 120 to access client data requested by the server system 110. The client data may be stored on the storage devices 125 and 135 that are attached, via the storage adapter 250, to the storage system 120 or other node of a storage system as defined herein. The storage adapter 250 includes input/output (I/O) interface circuitry that couples to the storage devices 125 and 135 over an I/O interconnect arrangement, such as a conventional high-performance, Fibre Channel serial link topology. In response to an access request received from a server system 110, data may be retrieved by the storage adapter 250 and, if necessary, processed by the processor 220 (or the adapter 250 itself) prior to being forwarded over the system bus 260 to the network adapter 210, where the data is formatted into a packet and returned to the server system 110.

In an illustrative embodiment, the primary storage devices 125 may comprise disks that are arranged into a plurality of volumes, each having a file system associated therewith. In one embodiment, the storage devices 125 comprise disks that are configured into a plurality of RAID (redundant array of independent disks) groups whereby multiple primary storage devices 125 are combined into a single logical unit (i.e., RAID group). In a typical RAID group, primary storage devices 125 of the group share or replicate data among the disks which may increase data reliability or performance. The primary storage devices 125 of a RAID group are configured so that some disks store striped data and at least one disk stores separate parity for the data, in accordance with a preferred RAID-4 configuration. However, other configurations (e.g. RAID-5 having distributed parity across stripes, RAID-DP, etc.) are also contemplated. A single volume typically comprises a plurality of primary storage devices 125 and may be embodied as a plurality of RAID groups.

The organization of a storage operating system 300 for the exemplary storage system 120 is now described briefly. However, it is expressly contemplated that the principles of the embodiments described herein can be implemented using a variety of alternative storage operating system architectures. As discussed above, the term "storage operating system" as used herein with respect to a storage system generally refers to the computer-executable code operable on a storage system and manages data access. In this sense, Data ONTAP® software is an example of such a storage operating system implemented as a microkernel. The storage operating system can also be implemented as an application program operating over a general-purpose operating system, such as UNIX® or Windows®, or as a general-purpose operating system with configurable functionality.

Figure 3:
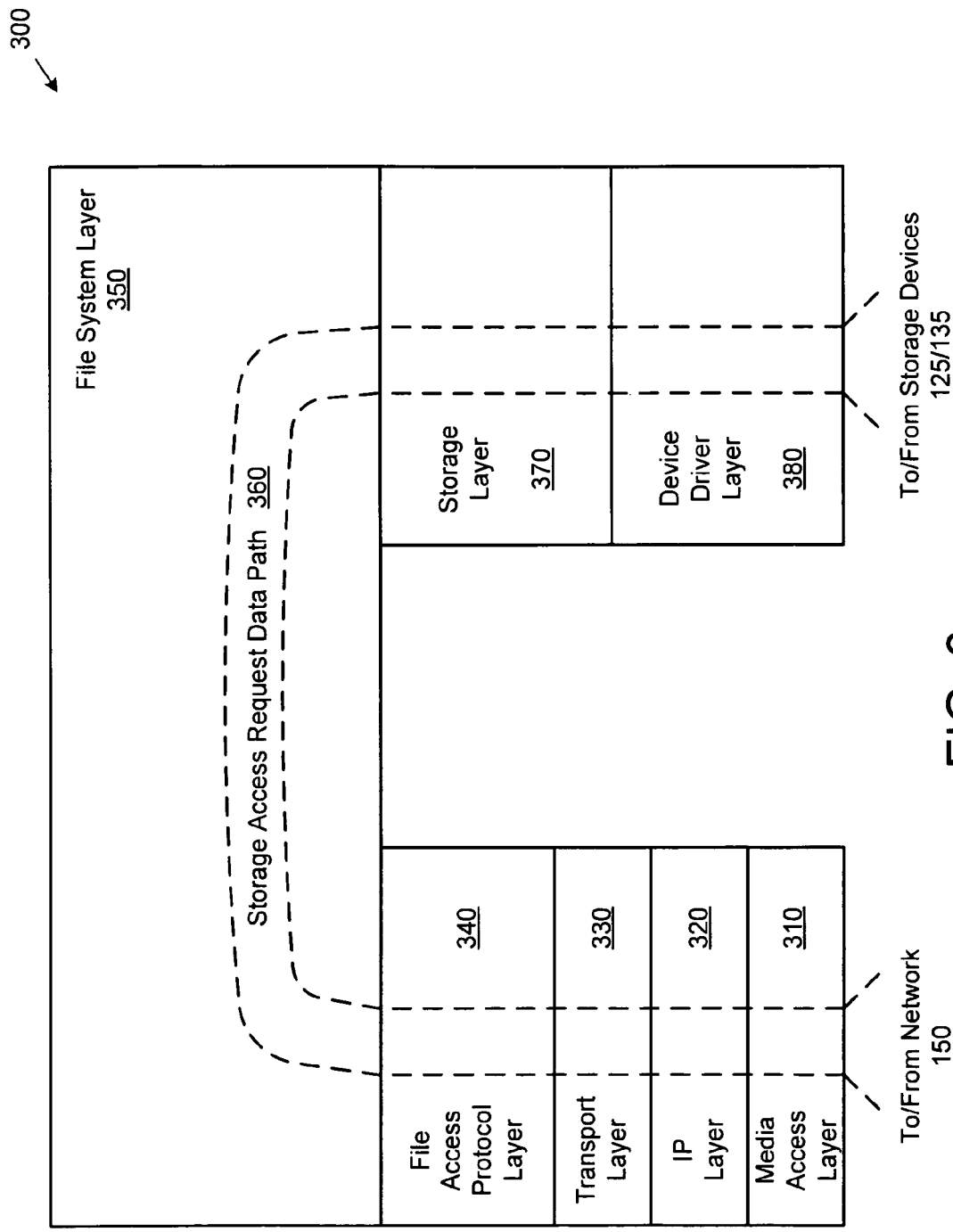
FIG. 3 is a schematic block diagram of an exemplary storage operating system that may be implemented by the storage system in FIG. 2.

As shown in FIG. 3, the storage operating system 300 comprises a series of software layers that form an integrated protocol software stack. The protocol stack provides data paths 360 for server systems 110 to access data stored on the storage system 120 using file-access protocols. The protocol stack includes a media access layer 310 of network drivers (e.g., an Ethernet driver). The media access layer 310 interfaces with network communication and protocol layers, such as the Internet Protocol (IP) layer 320 and the transport layer 330 (e.g., TCP/UDP protocol). The IP layer 320 may be used to provide one or more data access ports for server systems 110 to access the storage system 120. In some embodiments, the IP layer 320 layer provides a dedicated private port for each of one or more remote-file access protocols implemented by the storage system 120.

A file-access protocol layer 340 provides multi-protocol data access and, for example, may include support for the Hypertext Transfer Protocol (HTTP) protocol, the NFS protocol, and the CIFS protocol. The storage operating system 300 may include support for other protocols, including, but not limited to, the direct access file system (DAFS) protocol, the web-based distributed authoring and versioning (WebDAV) protocol, the Internet small computer system interface (iSCSI) protocol, and so forth. The storage operating system 300 may manage the primary storage devices 125 using a storage layer 370 that implements a storage protocol (such as a RAID protocol) and a device driver layer 380 that implements a device control protocol (such as small computer system interface (SCSI), integrated drive electronics (IDE), etc.).

Bridging the storage device software layers with the network and file-system protocol layers is a file system layer 350 of the storage operating system 300. In an illustrative embodiment, the file system layer 350 implements a file system having an on-disk format representation that is block-based using, for example, 4 KB data blocks. For each data block, the file system layer 350 may assign/associate a unique storage system address (e.g., a unique LBN) for storing data blocks in the set of storage devices. The file system layer 350 also assigns, for each file, a unique inode number and an associated inode. An inode may comprise a data structure used to store information about a file, such as ownership of the file, access permission for the file, size of the file, name of the file, location of the file, etc. Each inode may also contain information regarding the block locations of the file. In some embodiments, the block locations are indicated by LBNs assigned for each block of the file.

In response to receiving a file-access request, the file system generates operations to load (retrieve) the requested data from the storage devices. If the information is not resident in the storage system's memory 240, the file system layer 350 indexes into an inode using the received inode number to access an appropriate entry and retrieve a storage system address (e.g., LBN). The storage system address may then used by the file system layer 350, storage layer 370, and an appropriate driver of the device driver layer 380 to access the requested storage system address from the storage devices. The requested data may then be loaded in memory 240 for processing by the storage system 120. For a received write request containing client data to be stored on the storage devices at a specified storage system address, the storage system 120 may write the client data to the specified storage system address. Upon successful completion of the request, the storage system (and storage operating system) returns a response, e.g., a conventional acknowledgement packet defined by the CIFS specification, to the server system 110 over the network 150.

It should be noted that the software "path" 360 through the storage operating system layers described above needed to perform data storage access for the requests received at the storage system may alternatively be implemented in hardware or a combination of hardware and software. That is, in an alternative embodiment, the storage access request path 360 may be implemented as logic circuitry embodied within a field programmable gate array (FPGA) or an application specific integrated circuit (ASIC). This type of hardware implementation may increase the performance of the file service provided by storage system 120 in response to a file system request packet issued by server system 110. Moreover, in a further embodiment, the processing elements of network and storage adapters 210 and 250 may be configured to offload some or all of the packet processing and storage access operations, respectively, from processor 220 to thereby increase the performance of the data access service provided by the storage system.

II. Storage Operating System for Using an LLRRM Device

A. LLRRM Mapping Layer

Figure 4:
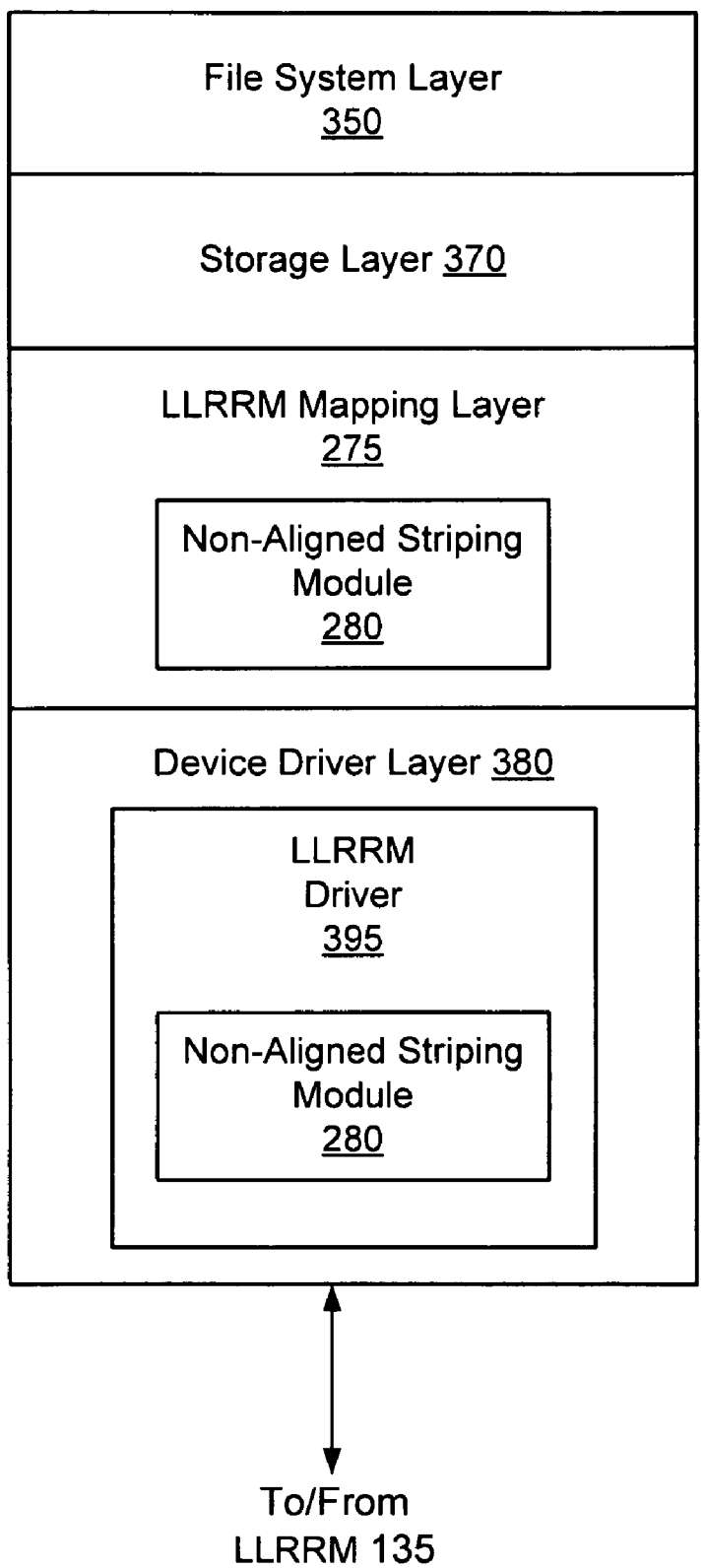
FIG. 4 shows a conceptual diagram of a remapping layer and a non-aligned striping module within the storage operating system.

When using LLRRM devices 135 as storage devices (as permanent storage devices and/or cache-type devices), the storage operating system 300 may implement additional layers such as a LLRRM mapping layer 275 and an LLRRM driver 395. FIG. 4 shows a conceptual diagram of a storage operating system 300 having an LLRRM mapping layer 275 and a non-aligned striping module 280. In some embodiments, the LLRRM mapping layer 275 and the non-aligned striping module 280 may comprise engines comprising firmware or software and hardware configured to perform embodiments described herein. In general, functions of a software module or software layer described herein may be embodied directly in hardware, or embodied as software executed by a processor, or embodied as a combination of the two.

The LLRRM mapping layer 275 may map/translate storage system addresses to LLRRM addresses by using and maintaining LLRRM mapping information. The LLRRM mapping layer 275 may do so using various methods known in the art. In some embodiments, the LLRRM mapping layer 275 and the LLRRM driver 395 operate in conjunction with the other software layers and file system of the storage operating system 300 to use an LLRRM device 135 as a storage device in the storage system 120. The LLRRM mapping layer 275 may reside between various software layers of the storage operating system 300. FIG. 4 shows a conceptual diagram of an example where the LLRRM mapping layer 275 resides between the storage layer 370 and the device driver layer 380 of the storage operating system 300.

The device driver layer 380 may be used to help perform the functions of the LLRRM mapping layer 275. The device driver layer 380 may receive commands (e.g., read page, write page, erase block), LLRRM addresses, data size, and any data blocks to be written at the LLRRM addresses from the LLRRM mapping layer 275. The device driver layer 380 may use the LLRRM addresses to locate and access particular storage locations on an LLRRM device 135 and perform the received commands. The device driver layer 380 may comprise different device drivers for different devices. When using LLRRM devices 135 as storage devices (as permanent storage devices and/or cache-type devices), the device driver layer 380 may comprise an LLRRM driver 395 configured for accessing requested storage locations on the LLRRM devices 135. For read commands, the device driver layer 380 accesses the appropriate data on the LLRRM devices 135 and loads requested data in memory 240 for processing by the storage system 120. Upon successful completion of the request, the storage operating system returns a response to the server system 110 over the network 150.

In the example of FIG. 4, the LLRRM mapping layer 275 may receive as input access-request information regarding a read or write request from the storage layer 370. The access-request information may include, for example, a request descriptor (e.g., read or write), a storage system address (e.g., LBN), and data size. The storage system address may specify a data block that is the starting point from which data is to be read or written. The data size may specify the amount of data to be read or written starting from the storage system address. For write requests, the LLRRM mapping layer 275 may also receive as input from the storage layer 370 the data to be written at the storage system address.

In general, for a received read request, the LLRRM mapping layer 275 may receive as input (from the storage layer 370) storage system addresses, map the storage system addresses to LLRRM addresses (using the LLRRM mapping information), and output the LLRRM addresses to the device driver layer 380 for retrieval of the requested data. In general, for a received write request, the LLRRM mapping layer 275 may receive as input (from the storage layer 370) storage system addresses and client data blocks to be written, store the client data blocks to LLRRM addresses in an LLRRM device 135, and update its LLRRM mapping information to reflect the storing of the client data blocks to the LLRRM addresses.

In some embodiments, the LLRRM device 135 may comprise a multi-bank, multi-chip device comprising a plurality of banks (each bank being simultaneously accessible in parallel), wherein each bank comprises a plurality of memory chips, each chip also being simultaneously accessible in parallel. When implementing a multi-bank, multi-chip LLRRM device 135 as a storage device, aligned data striping techniques are typically implemented to reduce latency in accessing data on the LLRRM device 135. In aligned data striping, received data blocks may be sub-divided into data sub-blocks and the data sub-blocks stored to the multiple chips of a same bank in the LLRRM device for maximizing use of the parallel accessibility feature of the chips.

In aligned striping, the data sub-blocks of a received data block are stored to the same erase-unit (EU) number, same page number, and same page offset number (indicating an offset within the page for identifying the LBN) of each chip in the same bank. As such, the LLRRM mapping information used by the LLRRM mapping layer 275 to map storage system addresses to the LLRRM address may be simplified and reduced in size. For example, to later access the striped data block from the LLRRM device, the LLRRM mapping information may only comprise a single bank number, a single EU number, a single page number, and a single page offset number, (since the EU, page, and offset numbers will be the same for each chip).

However, use of "aligned" data striping may cause a faster rate of reduction in the useable storage capacity of the LLRRM device. When a defective EU (e.g., an EU that no longer performs erase, write, or read operations) is detected in a chip of the LLRRM device, to maintain aligned data striping, the entire row of EUs across the remaining chips may also be declared defective (the row of EUs comprising EUs in the remaining chips having the same EU number as the defective EU).

An EU may become defective for any variety of reasons. For example, each erase-unit of an LLRRM device typically has a maximum number of erase cycles (maximum wear) that may be performed before the erase-unit begins exhibiting a high-frequency of errors and becomes unusable/defective. In other embodiments, an EU may be detected as defective for other reasons. A "detected defective" EU comprises may comprise an EU that is no longer able to successfully perform read, write, and/or erase operations. However, to maintain the aligned stripes needed in conventional aligned data striping, the EUs in the remaining chips may be "declared defective" even though they are in fact still functional and useable. The LLRRM mapping layer 275 may typically stop mapping data blocks to "detected defective" EUs as well as "declared defective" EUs. As such, detected and declared defective EUs will no longer be used to store data, which effectively reduces the storage capacity of the LLRRM device. Over time as more defective EUs are detected and more rows of EUs are declared defective, the useable storage capacity of the LLRRM device may be significantly reduced.

In some embodiments, the non-aligned striping module 280 works in conjunction with the LLRRM mapping layer 275 to perform non-aligned striping methods described herein. In some embodiments, the non-aligned striping module 280 may reside in the LLRRM driver 395. In other embodiments, the non-aligned striping module 280 may reside in the LLRRM mapping layer 275. The non-aligned striping module 280 may perform defective EU remapping and non-aligned data striping in a way that is transparent to the LLRRM mapping layer 275, and without requiring modifications of the LLRRM mapping layer 275.

When a defective EU is detected, the non-aligned striping module 280 may remap the defective EU to a reserve EU (rather than declaring the entire row of EUs across the remaining chips as defective). When the LLRRM mapping layer 275 later maps a data block for storage to the detected defective EU, the non-aligned striping module 280 may use the remapped reserve EU to store a data sub-block of the received data block, thus producing a non-aligned data stripe (having data sub-blocks stored to different erase-unit (EU) numbers, the same page number, and the same page offset number on different chips in the same bank). For performing non-aligned striping, the non-aligned striping module 280 may produce and maintain erase-unit (EU) EU remapping data structures 610 and erase-unit (EU) reserve data structures 650 for chips of the LLRRM device.

In some embodiments, an LLRRM device 135 may be used as a permanent storage device and/or as a temporary storage device (e.g., as a cache-type device). When the LLRRM 135 is used as a cache-type device (such as a main cache or victim cache), additional functionalities may be provided in the storage operating system 300. For example, a main cache may be allocated by the storage operating system for use by the file system 350 and have a predetermined storage size. For improved response to received read or write requests, the file system 350 may provide additional functions that temporarily store/cache particular data into the main cache for faster access. The storage operating system 300 may employ additional functionalities that provide caching techniques known in the art to determine which data to store to the main cache (e.g., such as techniques that predict which data is likely to be requested by future client requests). Since the allocated storage size of the main cache is relatively small, data stored in the main cache may be routinely transferred ("evicted") out of the main cache to make space for new incoming data. Data transferred out of the main cache (referred to as "evicted data") may be transferred to a victim cache for storage. In some embodiments, when using an LLRRM device as a victim cache to store evicted data, the file system 350 may include additional functionalities for keeping track of the data stored in the victim cache and managing access to the victim cache.

B. Overview of Multi-Bank, Multi-Chip LLRRM Devices

A brief overview of the storage architecture of multi-bank, multi-chip LLRRM devices 135 is provided. In the embodiments below, the description and terms (e.g., "erase-unit," "page," etc.) commonly applied to flash memory devices may be used. The description and terms used below, however, should not be narrowly construed to apply only to flash memory devices. As such, the below embodiments may be applied to any LLRRM device. As such, the below embodiments may be applied to any multi-chip LLRRM device.

Figure 5A:
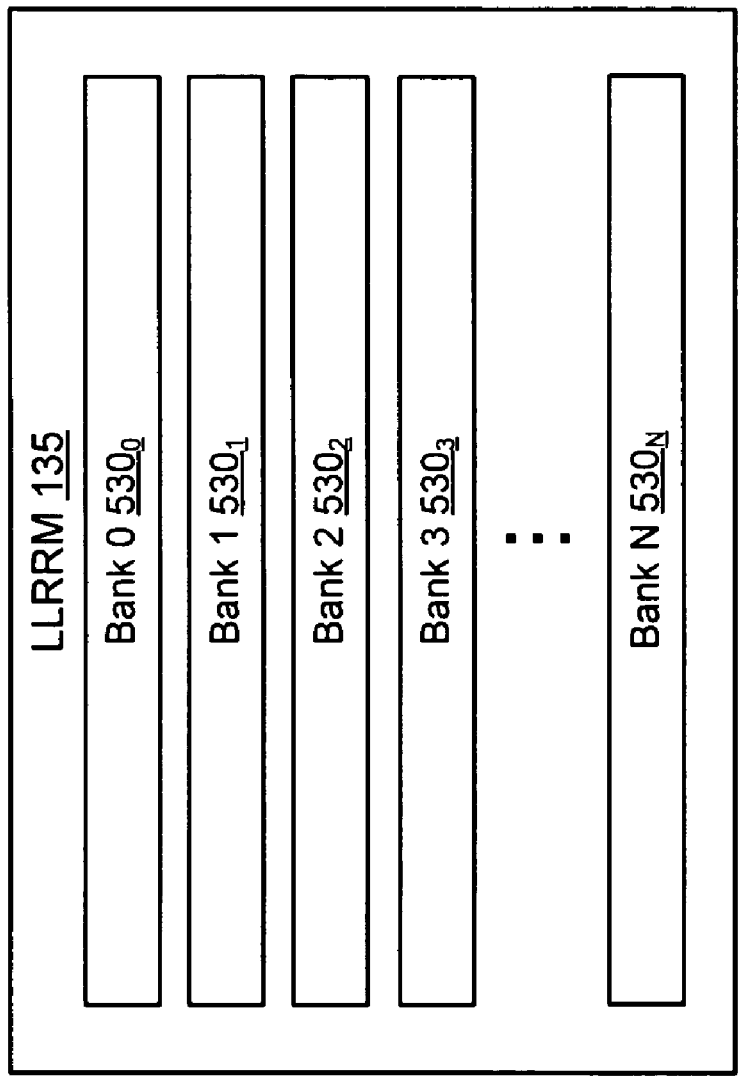
FIGS. 5A-B show conceptual diagrams of the storage architecture of a LLRRM device.

FIG. 5A shows a conceptual diagram of the storage architecture of a generic LLRRM device 135. The LLRRM device 135 may comprise the LLRRM devices 135 shown in FIGS. 1-2 (implemented as a permanent or temporary storage device). As shown in the example of FIG. 5A, the LLRRM device 135 may comprise one or more memory banks $230_0$, $230_1$, $230_2$, . . . $230_N$, where N is an integer. The LLRRM device 135 provides a "total" storage space spanning a "total" LLRRM address range (to which the LLRRM mapping layer 275 may map storage system addresses). Each memory bank 230 may provide a "bank" storage space comprising a sub-set of the total storage space, each bank storage space comprising a "bank" LLRRM address range that comprises a sub-set of the total LLRRM address range. In some embodiments, each bank 230 and bank LLRRM address range may be accessed concurrently in parallel with the accessing of any other bank 230 or bank LLRRM address range. At the same time, the multiple banks are also typically concatenated or otherwise organized to operate as a single memory device of greater capacity. In some embodiments, the multiple banks 230 have adjacent bank LLRRM address ranges that together provide a contiguous LLRRM address range comprising the total LLRRM address range.

Figure 5B:
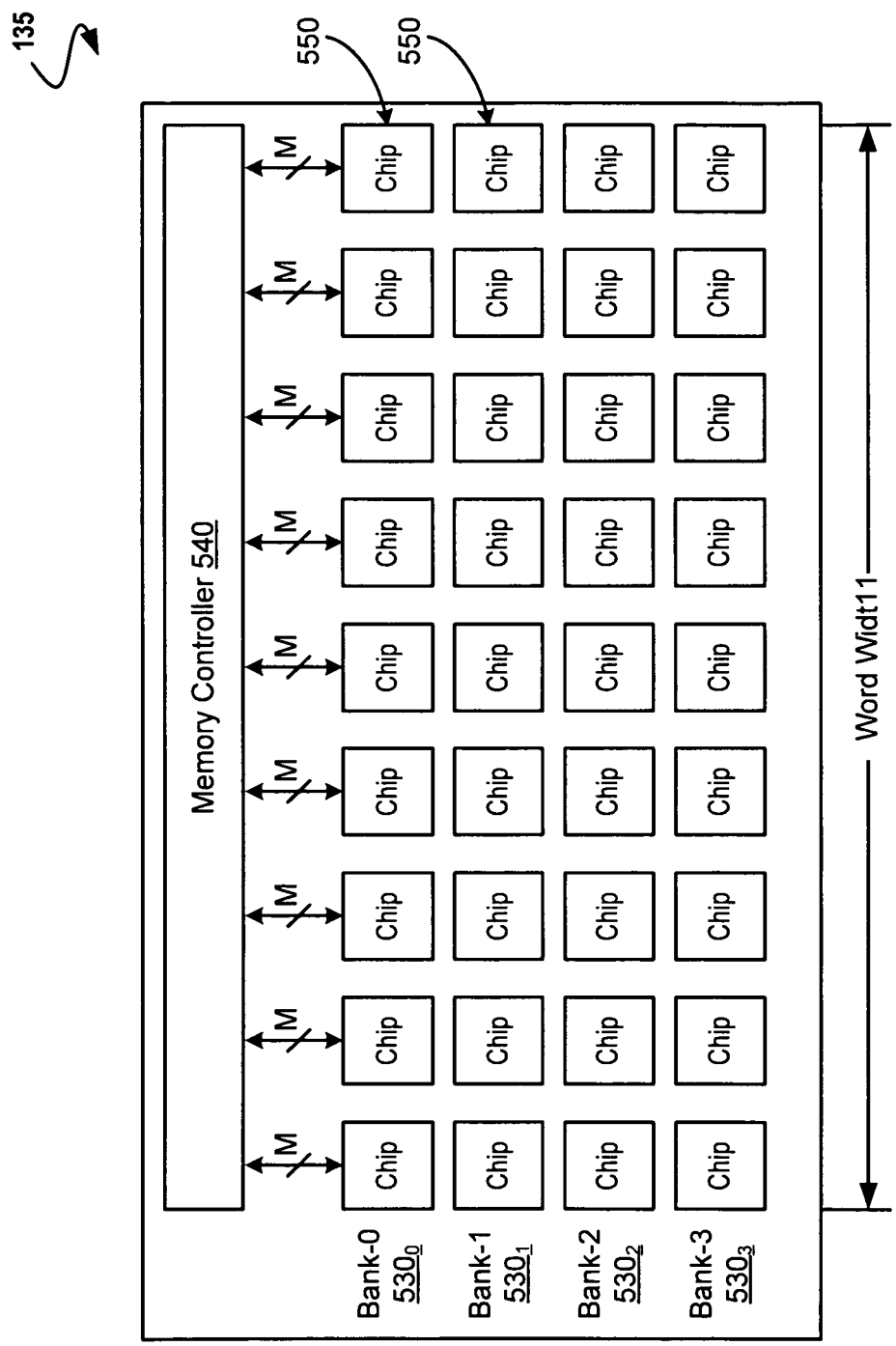

FIG. 5B shows a detailed view of a conceptual diagram of an LLRRM device 135, in which some embodiments operate. As shown, the LLRRM 135 of FIG. 5B is comprised of a physical memory controller 540 connected with a plurality of banks $230_0$, $230_1$, $230_2$, $230_3$, . . . $230_N$. Each bank 230 comprises a plurality of memory chips 550. Each bank 230 is accessible by the controller 540 through bus structures between the controller 540 and a chip 550 within a particular bank 230 (not shown). The bit width M (e.g., 8 bits) of each chip 550 in each bank is bit-wise concatenated into a word width (e.g., 64 bits of data, plus 8 bits of parity). These examples are purely exemplary, and any bit width (represented herein as "M") and/or word width, with or without parity, can be implemented using chips 550. The memory chips of a bank 230 together provide the overall storage space for the bank (i.e., bank storage space) and the overall address range for the bank (i.e., bank LLRRM address range).

In some embodiments, each chip 550 of a same bank may be accessed concurrently in parallel with the accessing of any other chip 550 in the same bank 230. In the example of FIG. 5B, each bank comprises 9 chips that may be concurrently in parallel (8 chips storing client data and 1 chip storing parity data). In some embodiments, a data block is stored to a bank by striping data sub-blocks across multiple chips of the bank. In these embodiments, an LLRRM address for a data block may specify the bank number, EU number, page number, and page offset number. In some embodiments, the LLRRM address for a data block may not specify a chip number (since the data block is sub-divided and stored across all chips of the bank in a stripe).

Figure 6:
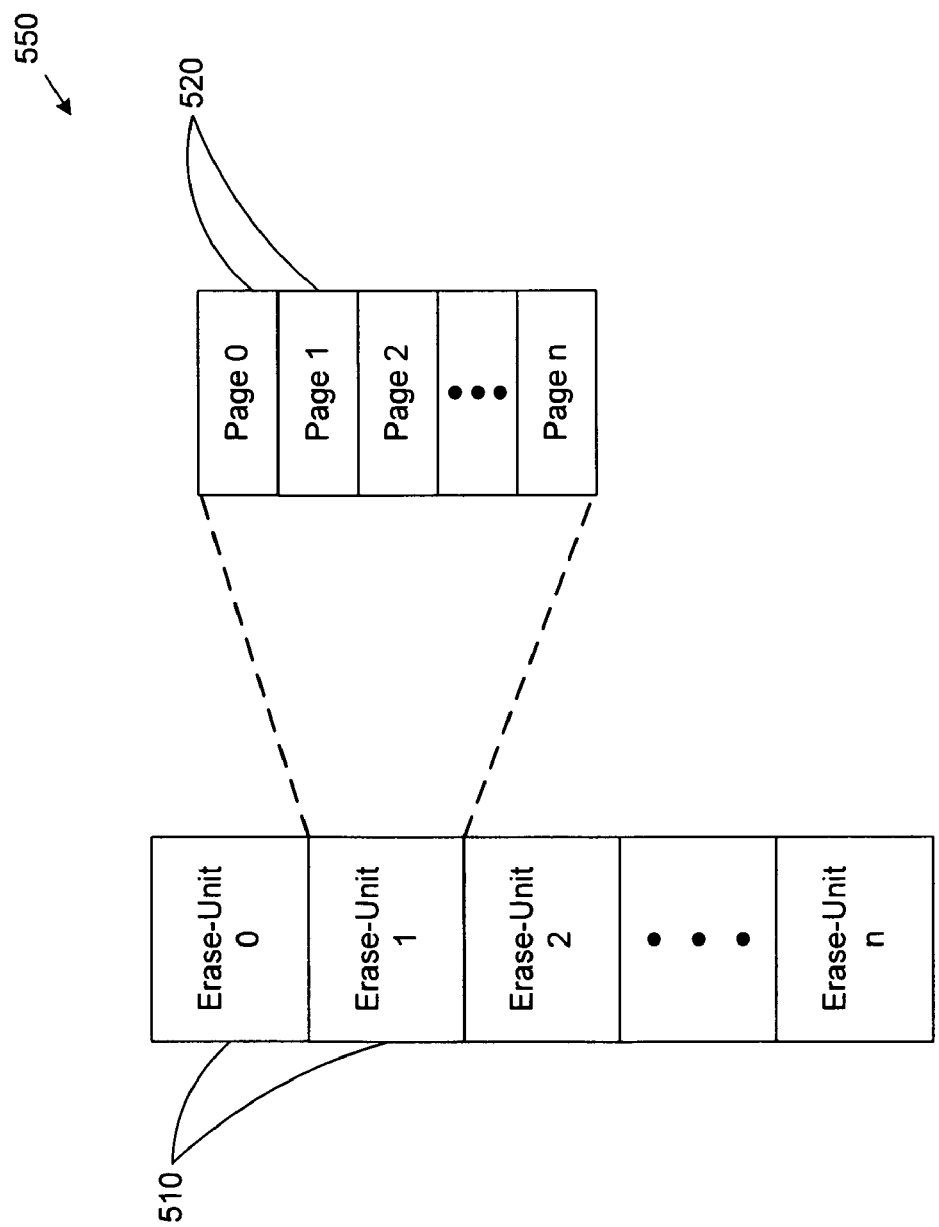
FIG. 6 shows a conceptual diagram of the storage architecture of a generic chip of an LLRRM device.

FIG. 6 shows a conceptual diagram of the storage architecture of a generic chip 550 of an LLRRM device 135. As shown in the example of FIG. 6, the storage space of the chip 550 may be partitioned/divided into a plurality of erase-units 510. The storage space of each erase-unit 510 may also be partitioned/divided into a plurality of pages 520. Although the terms "erase-unit" and "page" are used in some embodiments, these terms should not be construed narrowly. In general, as used herein, an "erase-unit" may indicate a sub-portion of the storage space of chip 550 and an LLRRM device 135, and a "page" may indicate a sub-portion of the storage space of an erase-unit 510.

Each page 520 of an erase-unit 510 may be configured for storing a predetermined amount of data. A page may comprise a fixed-sized amount of data that comprises the smallest amount of storage space that may be accessed (read or written) on an LLRRM device 135. For example, an erase-unit 510 may be 128 KB in size and contain 32 pages 520, each page 520 comprising a 4 KB data block. Client data may be written/stored to pages 520 of an erase-unit 510 until the erase-unit is filled. After an erase-unit 510 is "filled" (i.e., after new data is written to the last available page of the erase-unit), new client data may be received for a particular page in the erase-unit 510. For conventional LLRRM devices, before a previously written page can be overwritten with new client data, the page 520 must first be erased before it can be written to again. Also, for conventional LLRRM devices, a single page can not be erased and written to with new data. Rather, the entire erase-unit in which the page resides must typically be erased before the new client data can be written to the particular page.

Each EU 510 of a memory chip 550 of a bank may provide an "EU" storage space comprising a sub-set of the chip storage space. As such, as more defective EUs are found, the storage space of the LLRRM device 135 is further reduced. As used herein, an erase-unit that the LLRRM mapping layer 275 may map data blocks to may be referred to as an "available" erase-unit (EU) that may receive and store client data. An "unavailable" erase-unit (EU) may refer to an EU that has been detected or declared as defective. In some embodiments, an unavailable EU may also refer to a reserve EU that has been set aside (and is listed on an EU reserve data structure) and may become an available EU only upon it replacing (through remapping) a defective EU. In some embodiments, unavailable EUs may be listed in the EU reserve data structures 650 that are read by or made available to the LLRRM mapping layer 275 for determining which EUs may be mapped to. The LLRRM mapping layer 275 may not map data blocks to unavailable EUs. Thus the larger the number of unavailable EUs in an LLRRM device 135, the smaller the total available LLRRM address space to map to and the smaller the useable storage capacity of the LLRRM device 135.

Each bank 530 in an LLRRM device 135 may have an associated identifier that uniquely identifies the bank 530 within the LLRRM device, each chip 550 in a bank may have an associated identifier that uniquely identifies the chip within the bank 530, each EU 510 in a chip 550 may have an associated identifier that uniquely identifies the EU within the chip 550, and each page 520 in an EU 510 may have an associated identifier that uniquely identifies the page 520 in the EU 510. A page offset identifier may be used to uniquely identify offset locations relative to the beginning of the page to indicate where a particular data sub-block is stored within the page 520. An identifier is typically a number, but in other embodiments, other identifiers may be used. An LLRRM address of a page 520 may also indicate the physical location of the page in the LLRRM device 135 relative to other pages 520 at other LLRRM address.

C. Aligned Data Striping

Figure 7:
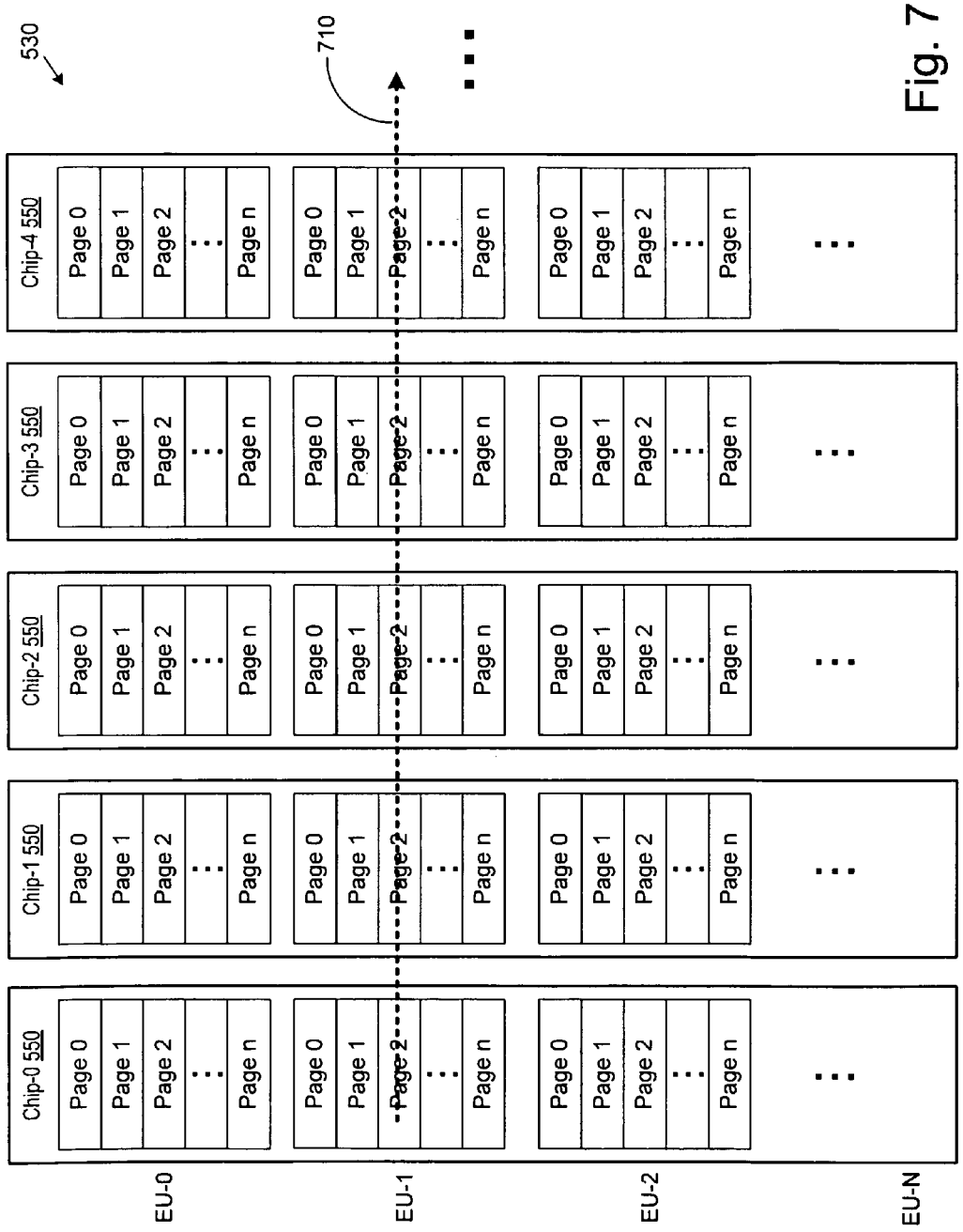
FIG. 7 shows a conceptual diagram of aligned data striping in a bank of an LLRRM device.

FIG. 7 shows a conceptual diagram of aligned data striping in a bank 530 of an LLRRM device 135. To reduce latency in accessing data on the LLRRM device, received data blocks to be stored to the LLRRM device may be striped across several chips of the same bank. In data striping, a received data block may be sub-divided into data sub-blocks and the data sub-blocks stored to the multiple chips 550 of the same bank 530. FIG. 7 shows conventional striping using "aligned" data stripes 710, whereby the data sub-blocks of a received data block are stored to the same EUs number (e.g., EU-1), the same page number (e.g., Page-2), and same page offset K of each chip 550 in the same bank 530. This may simplify and reduce the LLRRM mapping information to find the LLRRM address where the received data block may be read from on the LLRRM device. For example, to later access the data block from the LLRRM device, the LLRRM mapping information may only comprise a single bank number, a single EU number (e.g., EU-1), a single page number (e.g., Page-2), and a single page offset number K, since the EU and page numbers will be the same for each chip in the bank.

Since an LLRRM address of a page 520 may also indicate the physical location of the page in the LLRRM device 135 relative to other pages 520 at other LLRRM address, aligned striping using same EU and page numbers may produce actual physical location alignment (on the LLRRM device) of the pages that hold the data sub-blocks of a data block. As shown in the example of FIG. 7, pages having LLRRM addresses comprising the same EU and page numbers may be located adjacent to each other on different chips of the same bank. Thus an aligned data stripe may indicate an alignment of the physical storage locations of the data in the data stripe as well.

Figure 8:
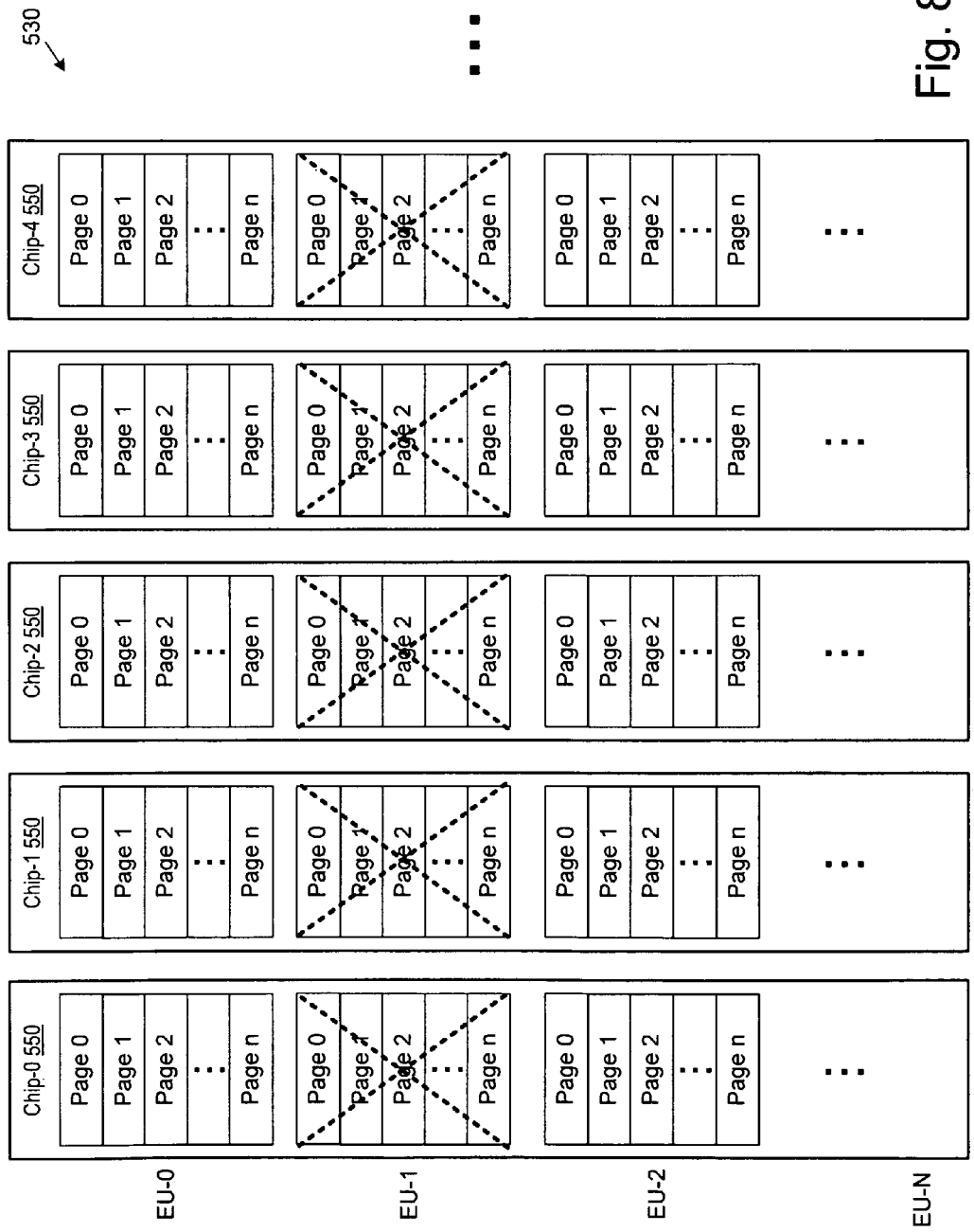
FIG. 8 shows a conceptual diagram of declaring a row of EUs defective in aligned data striping.

FIG. 8 shows a conceptual diagram of declaring a row of EUs defective in aligned data striping in the bank 530 of FIG. 7. When performing aligned data striping, when a defective EU is detected in a chip of the LLRRM device, to maintain aligned data striping, the entire row of EUs across the remaining chips may also be declared defective (the row of EUs comprising EUs in the remaining chips having the same EU number as the defective EU). In the example of FIG. 8, EU-1 of chip-0 may be detected as being defective. As such, each EU-1 in the remaining chips (e.g., chips 1-8) may be declared defective (and no longer be used to store data) to maintain aligned data striping.

III. Non-Aligned Data Striping

Described herein are method and apparatus for remapping defective EUs to reserve EUs to produce non-aligned data striping in a multi-chip LLRRM device 135. For performing such, the non-aligned striping module 280 may produce and maintain erase-unit (EU) remapping data structures 610 and erase-unit (EU) reserve data structures 650 for each chip 550 of each bank 530 of an LLRRM device 135. The data structures may be stored in memory 240 and/or NVRAM 245.

A. EU Remapping and Reserve Data Structures

Figure 9:
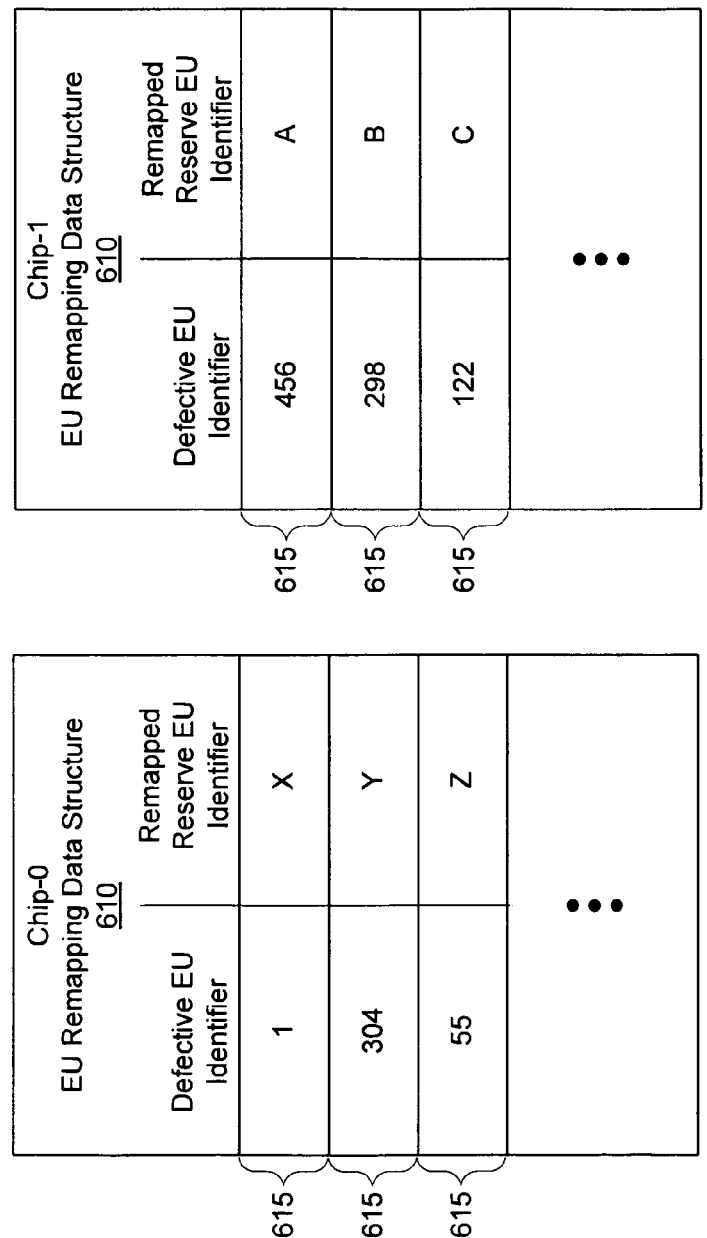
FIG. 9 shows a conceptual diagram of EU remapping data structures.

FIG. 9 shows a conceptual diagram of EU remapping data structures 610 that may be produced and maintained for chips of an LLRRM device. In some embodiments, the non-aligned striping module 280 produces and maintains an EU remapping data structure 610 for each chip 550 of each bank 530 of an LLRRM device 135. The EU remapping data structure 610 may be used to store EU remapping entries 615 representing remappings of detected defective EUs to reserve EUs. As shown in the example of FIG. 9, the EU remapping data structure 610 may comprise a plurality of EU remapping entries 615, each EU remapping entry 615 containing a detected defective EU identifier field and a remapped reserve EU identifier field (specifying the reserve EU where the detected defective EU has been remapped on the same chip).

Figure 10:
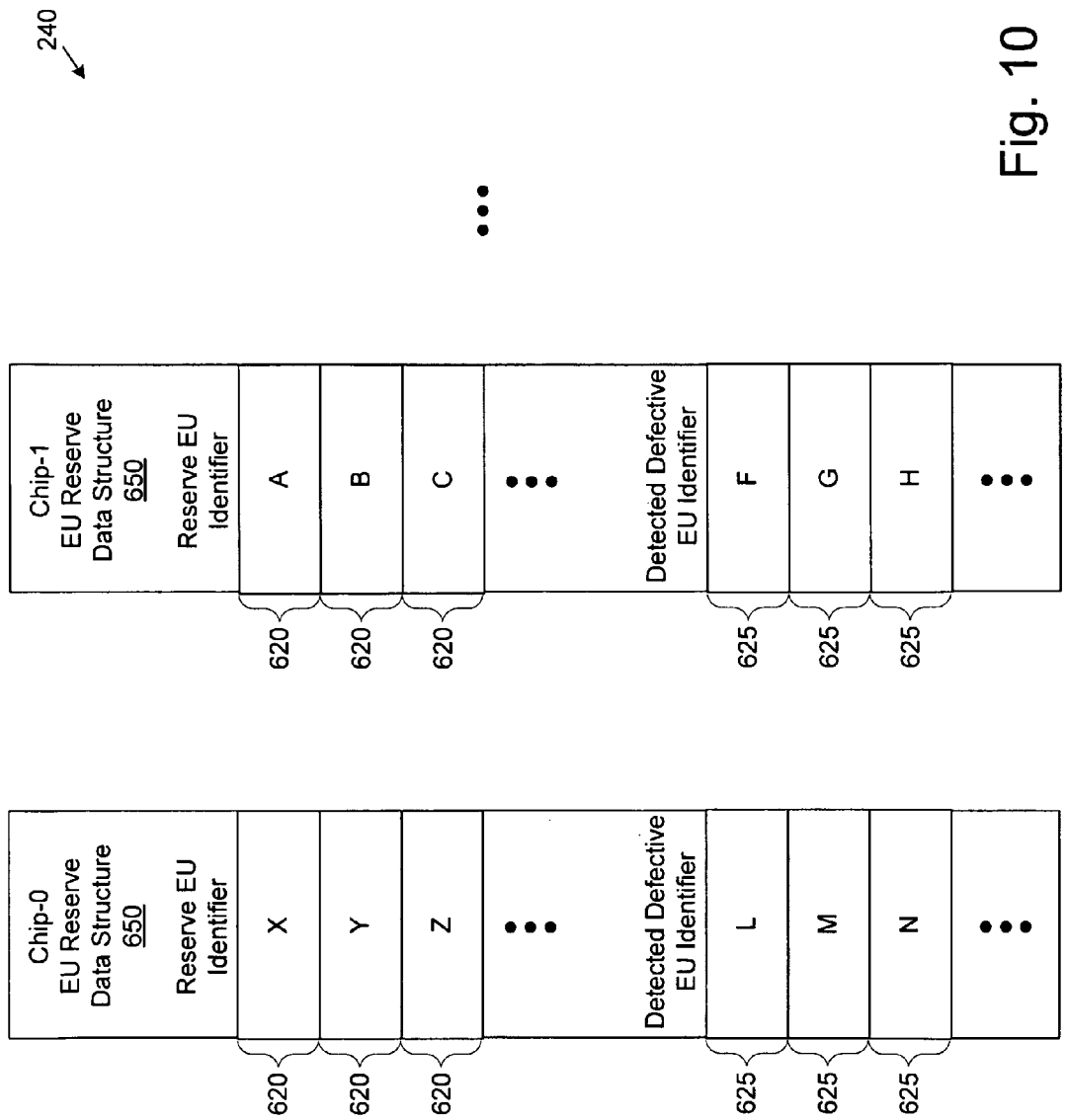
FIG. 10 shows a conceptual diagram of EU reserve data structures.

FIG. 10 shows a conceptual diagram of EU reserve data structures 650 that may be produced and maintained for chips of an LLRRM device. In some embodiments, the non-aligned striping module 280 produces and maintains an EU reserve data structure 650 for each chip 550 of each bank 530 of an LLRRM device 135. The EU reserve data structure 650 may be used to store EU reserve entries 620 representing reserve EUs for the chip that may be used to replace detected defective EUs in the same chip.

As shown in the example of FIG. 10, the EU reserve data structure 650 may comprise a plurality of EU reserve entries 620, each EU reserve entry 620 containing an reserve EU identifier field. Upon detecting a defective EU in a chip, the non-aligned striping module 280 may examine the EU reserve data structure 650 to determine if there are any reserve EUs listed for the chip that can replace the defective EU. If so, the non-aligned striping module 280 may select a reserve EU from the EU reserve data structure 650 and remap the defective EU to the selected reserve EU (by adding a new remapping entry 610 to the EU remapping data structure 610 for the chip to reflect the new remapping). The non-aligned striping module 280 may also remove the reserve entry 620 for the selected reserve EU from the EU reserve data structure 650.

In some embodiments, an EU reserve data structure 650 may also store EU detected defective entries 625 representing defective EUs that have been detected for a chip 550. In other embodiments, the detected defective entries 625 representing defective EUs that have been detected for a chip 550 may be stored to a separate data structure. The LLRRM mapping layer 275 may use the EU reserve data structures 650 to determine which EUs are available EUs that may be mapped to for storing client data and which EUs are unavailable EUs that may not be mapped to for storing client data. The unavailable EUs may include detected defective EUs, declared defective EUs, and reserve EUs. In other embodiments, the non-aligned striping module 280 may send data regarding available EUs and/or unavailable EUs to the LLRRM mapping layer 275 so the LLRRM mapping layer 275 may determine which EUs to map data blocks to.

B. Remapping Defective EUs to Produce Non-Aligned Stripes

Figure 11:
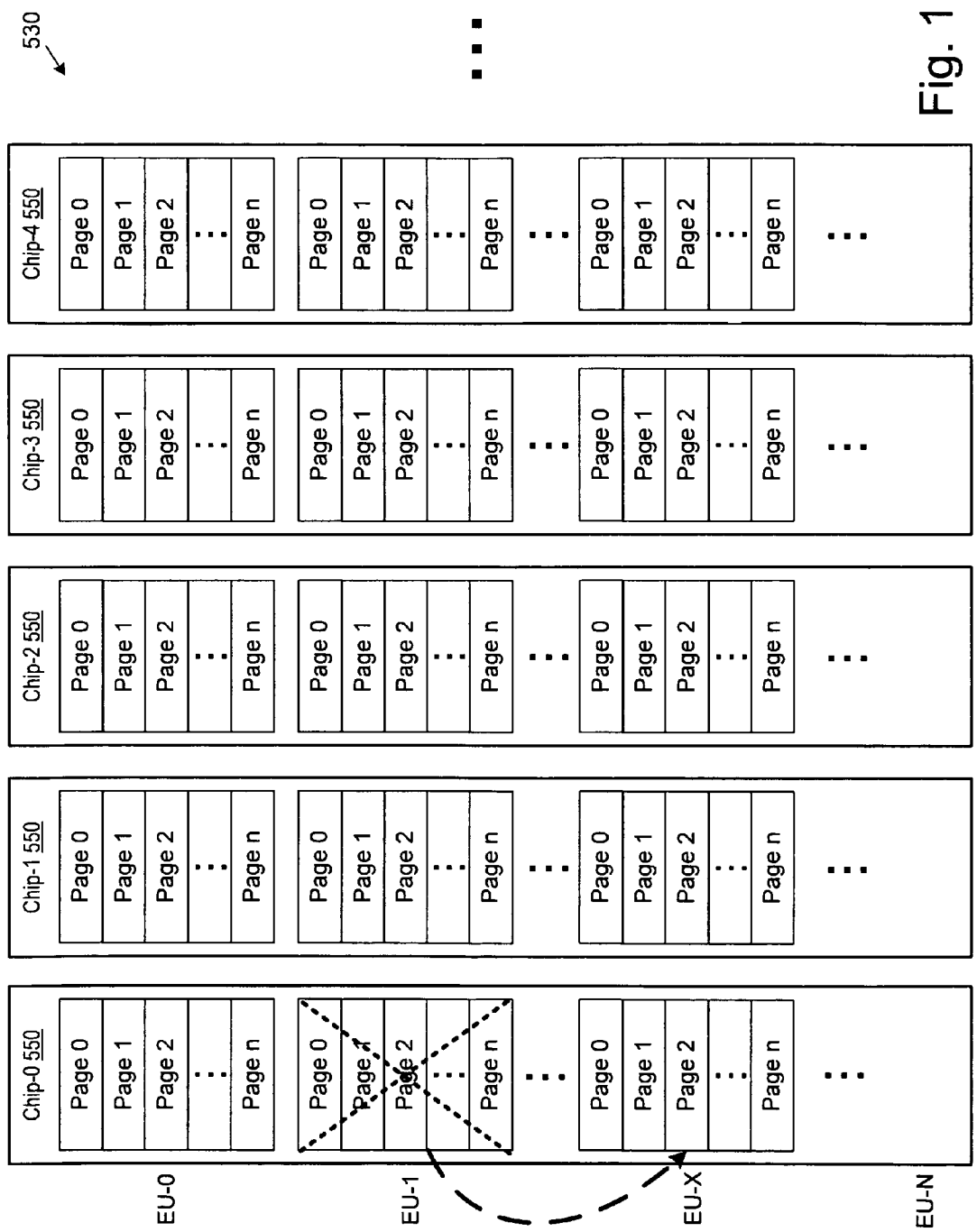
FIG. 11 shows a conceptual diagram of remapping a defective EU to a reserve EU on a chip.

FIG. 11 shows a conceptual diagram of remapping a defective EU to a reserve EU on a chip 550. In the example of FIG. 9, EU-1 of chip-0 may be detected as being defective. Upon detection of a defective EU in a particular chip of the bank (referred to as a "marked" chip), the non-aligned striping module 280 may then identify a reserve EU for the marked chip from the EU reserve data structure 650. As used herein, a marked chip refers to a chip having a currently detected defective EU that is currently being processed by the non-aligned striping module 280. The remaining chips in the bank may sometimes be referred to as a set of "non-marked" chips (that may also contain detected defective EUs but which are not currently being processed). The non-aligned striping module 280 may then remap the defective EUs to the identified reserve EUs by updating the EU remapping data structure 610 for the marked chip to reflect the new remapping (e.g., by adding or modifying a remapping entry 615 to the EU remapping data structure 610). As shown in the example of FIG. 9, a remapping entry 615 for mapping defective EU-1 to reserve EU-X has been added to the EU remapping data structure 610 for marked chip-0.

An access request (read or write request) for a requested EU and requested page of the chips of the bank may then be later received by the LLRRM driver 395. For example, a write request for striping data sub-blocks of a data block across all EU-1s of all chips of the bank may be received. Upon receiving the access request, the non-aligned striping module 280 may then examine each EU remapping data structure 610 of each chip to determine if the requested EU in any of the chips have been remapped to a reserve EU (referred to herein as a "remapped" chip). As used herein, a chip having the currently requested EU (from a currently processed access request) that is remapped to a reserve EU may be referred to as a "remapped" chip. A chip not having the currently requested EU remapped to a reserve EU may be referred to as a "non-remapped" chip (that may also contain remapped requested EUs but which are not the currently requested EU). For each remapped chip, the non-aligned striping module 280 may cause the access request to be performed on the remapped reserve EU (rather than the requested EU) and the same requested page. For each non-remapped chip, the non-aligned striping module 280 may cause the access request to be performed on the same requested EU and the same requested page.

Figure 12:
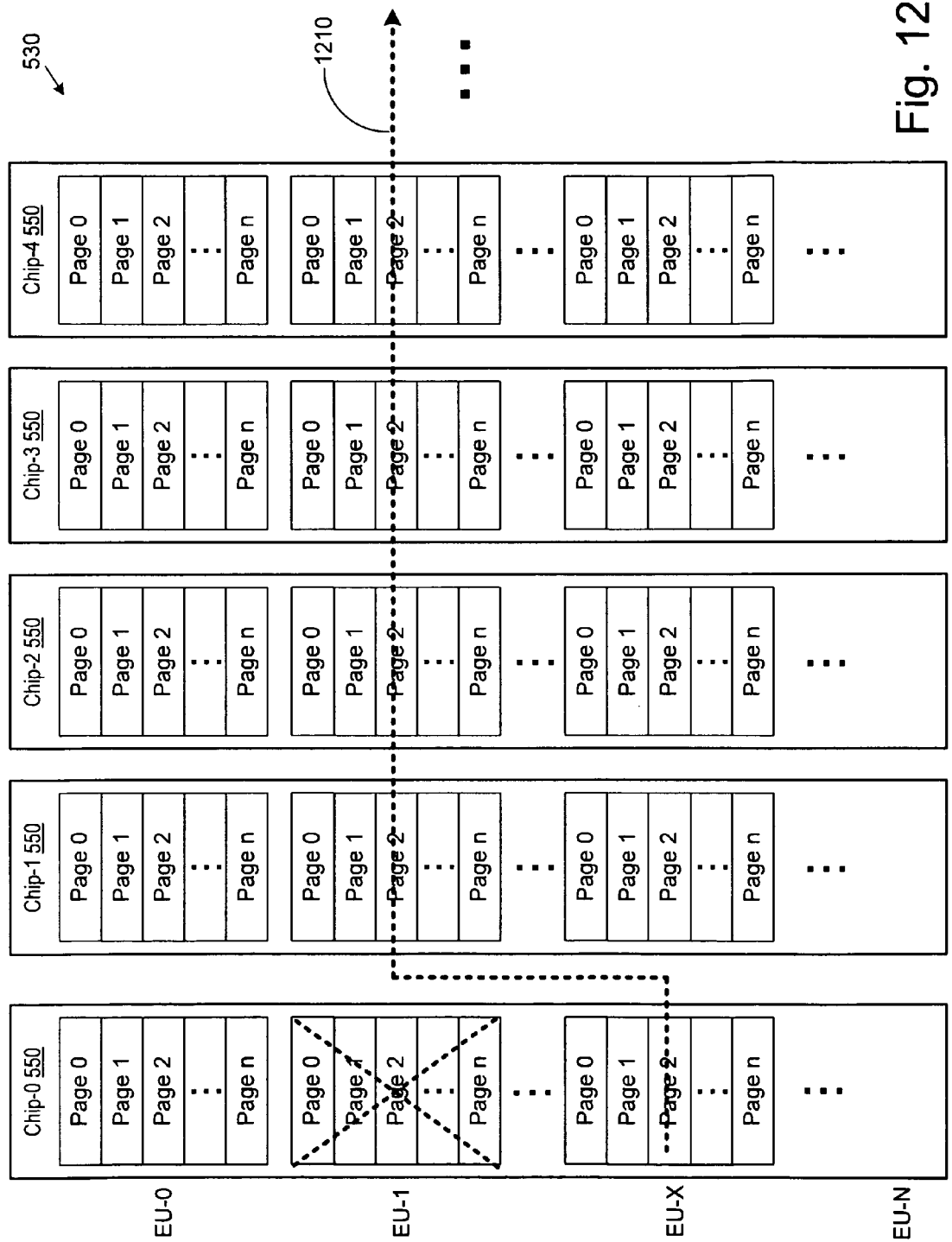
FIG. 12 shows a conceptual diagram of non-aligned data striping in a bank of an LLRRM device.

FIG. 12 shows a conceptual diagram of non-aligned data striping in a bank 530 of an LLRRM device 135. As shown in the example of FIG. 12, a write request for a data block is to be striped across requested EU-1 and requested page 2 of the chips 550 of the bank 530. Upon receiving the write request, the non-aligned striping module 280 may examine each EU remapping data structure 610 of each chip and determine that for chip-0 (remapped chip) the requested EU-1 has been remapped to reserve EU-X and that for all other chips (non-remapped chips) the requested EU-1 has not been remapped to a reserve EU. In some embodiments, the EU remapping data structures 610 of a chip may be maintained as a sparse array so that a single examination/lookup of a single source may be performed. As such, as shown in FIG. 12, for remapped chip-0, the non-aligned striping module 280 may cause the write request to be performed on the remapped reserve EU-X and the same requested page 2. For each non-remapped chip, the non-aligned striping module 280 may cause the write request to be performed on the same requested EU-1, the same requested page 2, and same page offset K. This may produce a non-aligned data stripe 1210 (as shown in FIG. 12).

In some embodiments, a data stripe may comprise a logical data stripe having a logical stripe number (e.g., comprising an LLRRM address having bank, EU, page, and/or page offset identifiers) that are mapped to aligned or non-aligned physical stripes in the LLRRM device. In these embodiments, an EU may comprise a logical EU, so that when a defective logical EU is detected, the logical EU is remapped to a different physical EU in the same chip. The logical stripe number may indicate the physical location of the logical data stripe in the LLRRM device 135 (e.g., whereby a logical stripe maps to a physical stripe with the same logical stripe numbers). In these embodiments, a non-aligned data stripe 1210 may indicate non-alignment of the physical storage locations of the data in the data stripe. In other embodiments, the logical stripe number may not indicate the physical location of the logical data stripe in the LLRRM device 135.

In the example of FIG. 12, for purposes of illustration, the non-aligned data stripe 1210 is shown to comprise a single non-aligned/remapped EU (EU-X in chip-0). In other embodiments, however, the non-aligned data stripe 1210 may comprise multiple non-aligned/remapped EUs across multiple chips. Also, in the example of FIG. 12, for purposes of illustration, a chip is shown to comprise a single remapped EU (EU-X in chip-0). In other embodiments, however, a chip may comprise multiple remapped EUs.

The non-aligned striping module 280 may process read requests (received for the non-aligned data stripe 1210) in a similar manner as described above in relation to FIG. 12. As shown in the example of FIG. 12, a read request for a data block that is striped across requested EU-1 and requested page 2 of the chips 550 may be received. Upon receiving the read request, the non-aligned striping module 280 may examine each EU remapping data structure 610 of each chip and determine that for chip-0 (remapped chip) the requested EU-1 has been remapped to reserve EU-X and that for all other chips (non-remapped chips) the requested EU-1 has not been remapped to a reserve EU. As such, as shown in FIG. 12, for remapped chip-0, the non-aligned striping module 280 may cause the read request to be performed on the remapped reserve EU-X and the same requested page 2. For each non-remapped chip, the non-aligned striping module 280 may cause the read request to be performed on the same requested EU-1 and the same requested page 2.

C. Determining Reserve EUs

In some embodiments, reserve EUs listed on the EU reserve data structures 650 may be pre-determined by the non-aligned striping module 280 prior to operation of the LLRRM device 135. In these embodiments, the non-aligned striping module 280 may set aside a predetermined set of one or more EUs in each chip for listing in the EU reserve data structure 650. For example, X % of EUs (e.g., the first or last X % of EUs) of each chip may be listed as reserve EUs in the EU reserve data structure 650 for each chip 550. As discussed above, reserve EUs may comprise unavailable EUs that reduce the storage capacity of the LLRRM device. However, since the number of reserve EUs are predetermined prior to operation of the LLRRM device, the total useable storage capacity may also be determined prior to operation of the LLRRM device and some assurances of the total useable storage capacity of the LLRRM device may be given to the storage system. As such, in these embodiments, the LLRRM device may be used as a permanent storage device. In other embodiments, however, the LLRRM device may also be used as a cache-type device (e.g., as a main or victim cache).

In other embodiments, reserve EUs listed on the EU reserve data structures 650 may be determined dynamically by the non-aligned striping module 280 during operation of the LLRRM device 135. In these embodiments, prior to operation of the LLRRM device, the non-aligned striping module 280 may not list any reserve EUs in the reserve data structure of each chip (or lists only a nominal number of reserve EUs) and adds reserve EUs to the reserve data structures 650 as defective EUs are detected and defective EUs are declared during operation of the LLRRM device.

In these embodiments, when a first defective EUs is detected on a chip (marked chip), the non-aligned striping module 280 may declare the row of corresponding EUs (having the same EU identifier as the defective EU) on the remaining non-marked chips of the same bank as defective (as shown in FIG. 8). Each declared defective EU of a non-marked chip is then added to the EU reserve data structure 650 of the non-marked chip.

When a next defective EUs is detected on any chip 550 (marked chip) of the bank 530, the non-aligned striping module 280 may first determine if the marked chip has a reserve EU listed in its reserve data structure. If not, the non-aligned striping module 280 may declare the row of corresponding EUs on the remaining non-marked chips of the same bank as defective as before (as shown in FIG. 8). If there is a reserve EU for the marked chip, however, the non-aligned striping module 280 may remap the detected defective EU to the reserve EU, as described above and shown in FIG. 11. This process may continue for each defective EU that is detected in the LLRRM device 135.

In these embodiments, since EUs are not predetermined, the storage capacity of the LLRRM device is not already reduced at the outset prior to operation of the LLRRM device, and is only reduced when defective EUs are actually detected. In these embodiments, since the number of reserve EUs may increase dynamically during operation of the LLRRM device (thus continuing to reduce its total useable storage capacity), assurances of the total useable storage capacity of the LLRRM may not be given (although assurance of a certain minimum storage capacity may be given). As such, in these embodiments, the LLRRM device may typically be used as cache-type device (e.g., as a main or victim cache) where assurances of the total useable storage capacity of the LLRRM are typically not required by the storage system.

D. Methods for Producing Non-Aligned Data Stripes

Figure 13:
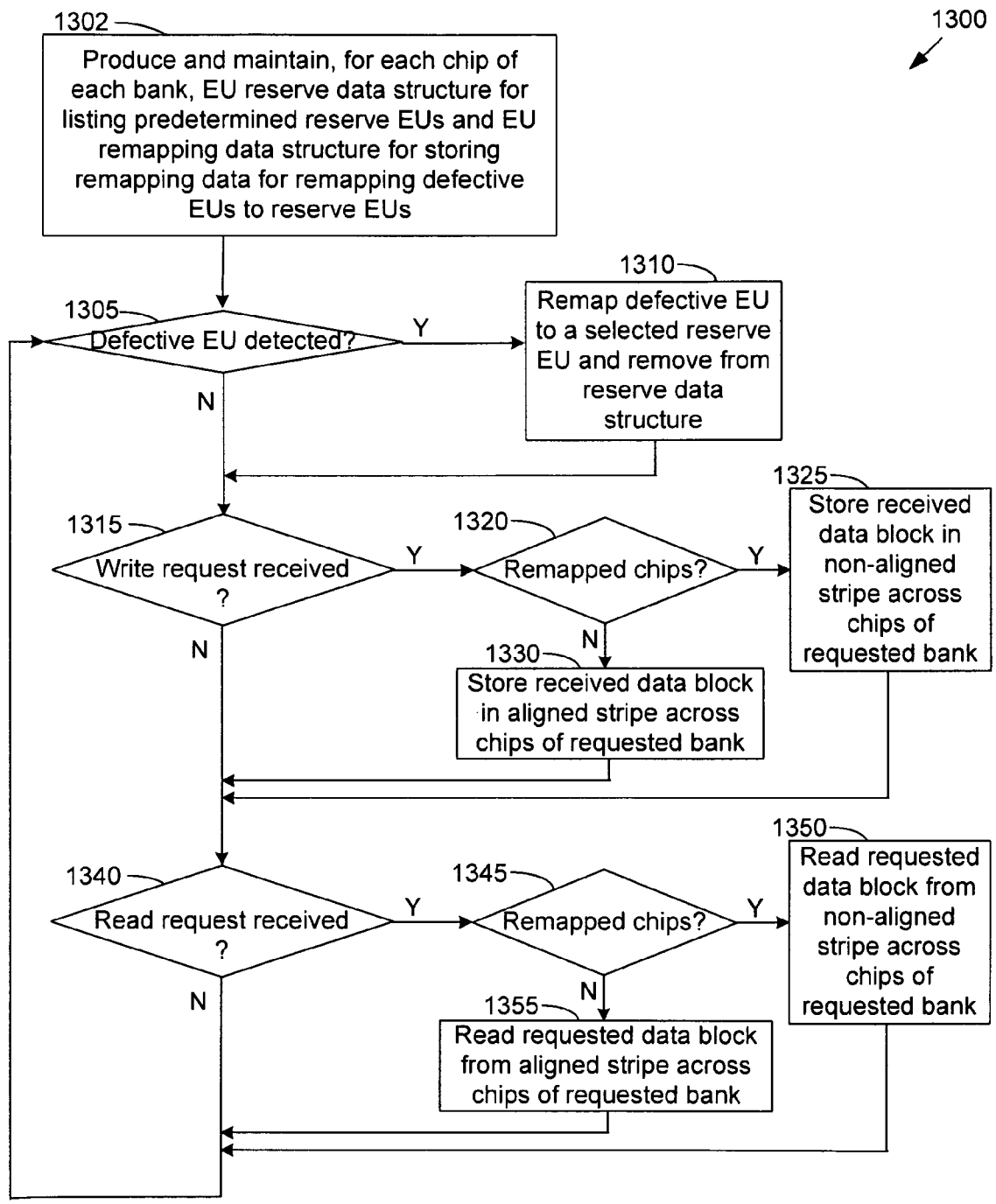
FIG. 13 is a flowchart of a method for performing non-aligned striping on an LLRRM device using static/predetermined reserve EUs.

FIG. 13 is a flowchart of a method 1300 for performing non-aligned striping on an LLRRM device using static/predetermined reserve EUs. In some embodiments, some of the steps of method 1300 are performed by the non-aligned striping module 280 in conjunction with the LLRRM mapping layer 275. In some embodiments, the LLRRM mapping layer 275 and the non-aligned striping module 280 comprise firmware or software and hardware configured to perform embodiments described herein. The order and number of steps of the method 1300 are for illustrative purposes only and, in other embodiments, a different order and/or number of steps are used. Also, in other embodiments, some steps of the method 1300 may be repeated for a number of iterations or continuously.

The method 1300 begins by producing and maintaining (at step 1302), for each chip 550 of each bank 530 in the LLRRM device, an EU reserve data structure 650 for listing predetermined reserve EUs in the chip for replacing defective EUs in the chip and an EU remapping data structure 610 for storing remapping data for remapping defective EUs in the chip to reserve EUs in the chip.

The method then determines (at 1305) whether a defective EU has been detected on a "marked" chip. If not, the method continues at step 1315. If so, the method 1300 remaps (at 1310) the defective EU to a selected reserve EU listed in the EU reserve data structure for the marked chip by updating the remapping data in the EU remapping data structure for the marked chip to reflect the new remapping (e.g., by adding a new remapping entry to the EU remapping data structure). The method also removes (at 1310) the listing of the selected reserve EU from the EU reserve data structure. The method continues at step 1315.

The method determines (at 1315) whether a write request has been received, the write request for storing at least one data block at an LLRRM address comprising a requested bank identifier, a request EU identifier, and a requested page identifier. If not, the method continues at step 1340. If so, the method 1300 determines (at 1320) whether any chips (referred to as remapped chips) in the requested bank (having the requested bank identifier) comprises a requested EU (having the requested EU identifier) that has been remapped to a reserve EU. The method may do so by examining the EU remapping data structures for each chip in the requested bank.

If so, the method stores (at 1325) the received data block in a non-aligned stripe across the chips of the requested bank. The method may do so by dividing the received data block into a plurality of sub-blocks and storing a sub-block to the requested page (having the requested page identifier) in the remapped reserve EU (having a different identifier than the requested EU identifier) in each remapped chip and storing a sub-block to the requested page (having the requested page identifier) in the requested EU (having the same identifier as the requested EU identifier) in each non-remapped chip of the requested bank. The method then continues at step 1340. In some embodiments, the method may store data in non-aligned stripes using sets of 8 data blocks minimum (or multiples of 8 data blocks), a set of 8 data blocks comprising a minimum write unit size to avoid partial writes operations to a page.

If the method 1300 determines (at 1320—No) that the requested bank does not contain any remapped chips, the method then stores (at 1330) the received data block in an aligned stripe across the chips of the requested bank. The method may do so by dividing the received data block into a plurality of sub-blocks and storing a sub-block to the requested page (having the requested page identifier) in the requested EU (having the same identifier as the requested EU identifier) in each chip of the requested bank. The method then continues at step 1340.

The method determines (at 1340) whether a read request has been received, the read request for retrieving at least one data block from an LLRRM address comprising a requested bank identifier, a request EU identifier, and a requested page identifier. If not, the method continues at step 1305. If so, the method 1300 determines (at 1345) whether any chips (referred to as remapped chips) in the requested bank (having the requested bank identifier) comprises a requested EU (having the requested EU identifier) that has been remapped to a reserve EU. The method may do so by examining the EU remapping data structures for each chip in the requested bank.

If so, the method reads (at 1350) the requested data block from a non-aligned stripe across the chips of the requested bank. The method may do so by reading a data sub-block at the requested page (having the requested page identifier) in the remapped reserve EU (having a different identifier than the requested EU identifier) in each remapped chip and reading a data sub-block at the requested page (having the requested page identifier) in the requested EU (having the same identifier as the requested EU identifier) in each non-remapped chip of the requested bank. The method then continues at step 1305.

If the method 1300 determines (at 1345—No) that the requested bank does not contain any remapped chips, the method then reads (at 1355) the requested data block from an aligned stripe across the chips of the requested bank. The method may do so by reading a data sub-block at the requested page (having the requested page identifier) in the requested EU (having the same identifier as the requested EU identifier) in each chip of the requested bank. The method then continues at step 1305.

Figure 14:
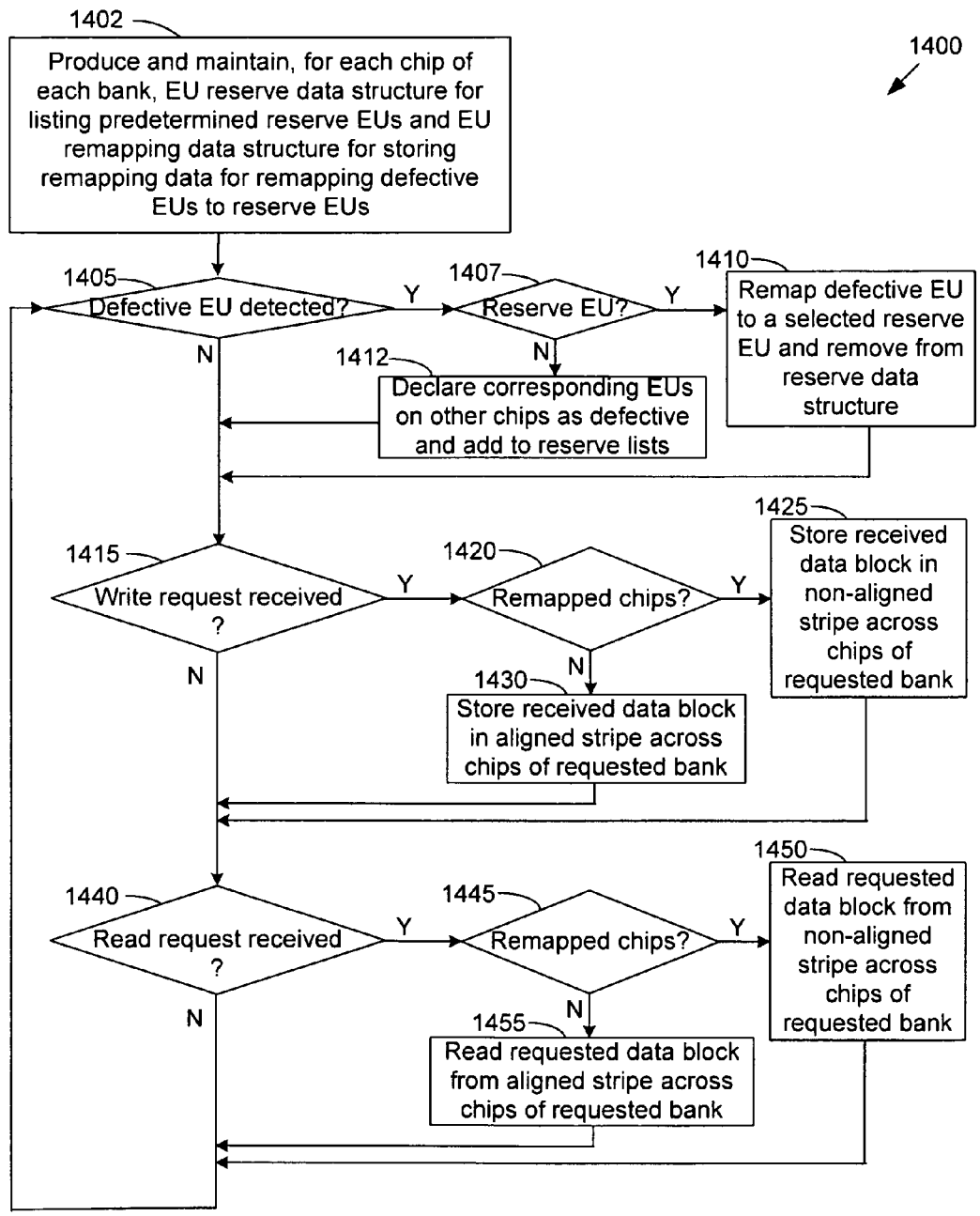
FIG. 14 is a flowchart of a method for performing non-aligned striping on an LLRRM device using dynamically determined reserve EUs.

FIG. 14 is a flowchart of a method 1400 for performing non-aligned striping on an LLRRM device using dynamically determined reserve EUs. In some embodiments, some of the steps of method 1400 are performed by the non-aligned striping module 280 in conjunction with the LLRRM mapping layer 275. In some embodiments, the LLRRM mapping layer 275 and the non-aligned striping module 280 comprise firmware or software and hardware configured to perform embodiments described herein. The order and number of steps of the method 1400 are for illustrative purposes only and, in other embodiments, a different order and/or number of steps are used. Also, in other embodiments, some steps of the method 1400 may be repeated for a number of iterations or continuously. Some of the steps of method 1400 are similar to the method 1300 of FIG. 13 and are not described in detail here.

The method 1400 begins by producing and maintaining (at step 1402), for each chip 550 of the bank 530, an EU reserve data structure 650 for listing predetermined reserve EUs in the chip for replacing defective EUs in the chip and an EU remapping data structure 610 for storing remapping data for remapping defective EUs in the chip to reserve EUs in the chip.

The method then determines (at 1405) whether a defective EU has been detected on a "marked" chip. If not, the method continues at step 1415. If so, the method 1400 determines (at 1407) whether the marked chip has at least one reserve EU (listed in the EU reserve data structure for the marked chip). If so, the method 1400 remaps (at 1410) the defective EU to a selected reserve EU listed in the EU reserve data structure for the marked chip and removes the listing of the selected reserve EU from the EU reserve data structure. The method then continues at step 1415.

If the marked chip does not have any reserve EUs, the method may declare (at 1412) the row of corresponding EUs (having the same EU identifier as the defective EU) on the remaining non-marked chips of the same bank as defective and add each declared defective EU of each non-marked chip to the EU reserve data structure of the non-marked chip (by adding the declared defective EU identifier to the reserve data structure for each non-marked chip). The method then continues at step 1415.

The method determines (at 1415) whether a write request has been received. If not, the method continues at step 1440. If so, the method 1400 determines (at 1420) whether any chips (referred to as remapped chips) in the requested bank (having the requested bank identifier) comprises a requested EU (having the requested EU identifier) that has been remapped to a reserve EU. If so, the method stores (at 1425) the received data block in a non-aligned stripe across the chips of the requested bank. The method then continues at step 1440. If the method 1400 determines (at 1420—No) that the requested bank does not contain any remapped chips, the method then stores (at 1430) the received data block in an aligned stripe across the chips of the requested bank. The method then continues at step 1440.

The method determines (at 1440) whether a read request has been received. If not, the method continues at step 1405. If so, the method 1400 determines (at 1445) whether any chips (referred to as remapped chips) in the requested bank (having the requested bank identifier) comprises a requested EU (having the requested EU identifier) that has been remapped to a reserve EU. If so, the method reads (at 1450) the requested data block from a non-aligned stripe across the chips of the requested bank. The method then continues at step 1405. If the method 1400 determines (at 1445—No) that the requested bank does not contain any remapped chips, the method then reads (at 1455) the requested data block from an aligned stripe across the chips of the requested bank. The method then continues at step 1405.

Some embodiments may be conveniently implemented using a conventional general purpose or a specialized digital computer or microprocessor programmed according to the teachings herein, as will be apparent to those skilled in the computer art. Appropriate software coding may be prepared by programmers based on the teachings herein, as will be apparent to those skilled in the software art. Some embodiments may also be implemented by the preparation of application-specific integrated circuits or by interconnecting an appropriate network of conventional component circuits, as will be readily apparent to those skilled in the art. Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Some embodiments include a computer program product comprising a computer readable medium (media) having instructions stored thereon/in when executed (e.g., by a processor) perform methods, techniques, or embodiments described herein, the computer readable medium comprising sets of instructions for performing various steps of the methods, techniques, or embodiments described herein. The computer readable medium may comprise a storage medium having instructions stored thereon/in which may be used to control, or cause, a computer to perform any of the processes of an embodiment. The storage medium may include, without limitation, any type of disk including floppy disks, mini disks (MD's), optical disks, DVDs, CD-ROMs, micro-drives, and magneto-optical disks, ROMs, RAMs, EPROMs, EEPROMs, DRAMs, VRAMs, flash memory devices (including flash cards), magnetic or optical cards, nanosystems (including molecular memory ICs), RAID devices, remote data storage/archive/warehousing, or any other type of media or device suitable for storing instructions and/or data thereon/in.

Stored on any one of the computer readable medium (media), some embodiments include software instructions for controlling both the hardware of the general purpose or specialized computer or microprocessor, and for enabling the computer or microprocessor to interact with a human user and/or other mechanism utilizing the results of an embodiment. Such software may include without limitation device drivers, operating systems, and user applications. Ultimately, such computer readable media further includes software instructions for performing embodiments described herein.

Included in the programming (software) of the general/specialized computer or microprocessor are software modules for implementing some embodiments.

Those of skill would further appreciate that the various illustrative logical blocks, modules, circuits, techniques, or method steps of embodiments described herein may be implemented as electronic hardware, computer software, or combinations of both. To illustrate this interchangeability of hardware and software, various illustrative components, blocks, modules, circuits, and steps have been described herein generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the embodiments described herein.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The techniques or steps of a method described in connection with the embodiments disclosed herein may be embodied directly in hardware, in software executed by a processor, or in a combination of the two. In some embodiments, a software module or software layer may comprise an engine comprising firmware or software and hardware configured to perform embodiments described herein. In general, functions of a software module or software layer described herein may be embodied directly in hardware, or embodied as software executed by a processor, or embodied as a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read data from, and write data to, the storage medium. In the alternative, the storage medium may be integral to the processor. The processor and the storage medium may reside in an ASIC. The ASIC may reside in a user device. In the alternative, the processor and the storage medium may reside as discrete components in a user device.

While the embodiments described herein have been described with reference to numerous specific details, one of ordinary skill in the art will recognize that the embodiments can be embodied in other specific forms without departing from the spirit of the embodiments. Thus, one of ordinary skill in the art would understand that the embodiments described herein are not to be limited by the foregoing illustrative details, but rather are to be defined by the appended claims.

We claim:

1. A storage system for storing data on a low-latency random read memory (LLRRM) device, the storage system comprising:
   the LLRRM device comprising a plurality of memory chips being simultaneously accessible for accessing data on the chips, each chip comprising a plurality of erase units, each erase unit (EU) having an EU identifier and comprising a plurality of pages for storing data, each page having a page identifier; and
   a storage operating system engine configured for:
      maintaining, for each chip, a reserve data structure for listing predetermined reserve EUs in the chip and a remapping data structure for storing remapping data for remapping defective EUs to reserve EUs in the chip;
      detecting a defective EU having a first EU identifier in a "marked" chip, the remaining chips comprising "non-marked" chips;
      remapping the defective EU to a selected reserve EU listed in the reserve data structure for the marked chip by updating the remapping data in the remapping data structure for the marked chip, the selected reserve EU having a second EU identifier;
      receiving at least one data block for storing to the LLRRM device; and
      striping each received data block across the plurality of chips in a non-aligned manner, the striping comprising:
         sub-dividing the data block into a plurality of data sub-blocks;
         in the marked chip, storing a data sub-block to a page, having a first page identifier, in the selected reserve EU having the second EU identifier; and
         in each non-marked chip, storing a data sub-block to a page, having the first page identifier, in an EU having the first EU identifier.

2. The storage system of claim 1, wherein the predetermined reserve EUs of a chip comprise the first or last X % of EUs of the chip.

3. The storage system of claim 1, wherein the LLRRM device comprises a permanent storage device or a variable capacity device.

4. The storage system of claim 1, wherein the storage operating system engine is further configured for removing the selected reserve EU from the reserve data structure for the marked chip.

5. The storage system of claim 1, wherein:
   the received data block is received in a write request comprising a requested EU identifier comprising the first EU identifier and a requested page identifier comprising the first page identifier.

6. The storage system of claim 5, wherein the storage operating system engine is further configured for:
   prior to storing a data sub-block to the marked chip, examining the remapping data structure for the marked chip to determine that the requested EU has been remapped to the selected reserve EU; and
   prior to storing a data sub-block to a non-marked chip, examining the remapping data structure for the non-marked chip to determine that the requested EU has not been remapped to a reserve EU.

7. The storage system of claim 1, wherein the storage operating system engine is further configured for:
   receiving a read request for the data block, the read request comprising a requested EU identifier comprising the first EU identifier and a requested page identifier comprising the first page identifier; and reading the data block from the plurality of chips in a non-aligned manner, the reading comprising:
in the marked chip, reading a data sub-block from the page, having the first page identifier, in the selected reserve EU having the second EU identifier; and
in each non-marked chip, reading a data sub-block from the page, having the first page identifier, in the EU having the first EU identifier.

8. A method for storing data on a low-latency random read memory (LLRRM) device comprising a plurality of memory chips being simultaneously accessible for accessing data on the chips, each chip comprising a plurality of erase units, each erase unit (EU) having an EU identifier and comprising a plurality of pages for storing data, each page having a page identifier, the method comprising:
maintaining, for each chip, a reserve data structure for listing predetermined reserve EUs in the chip and a remapping data structure for storing remapping data for remapping defective EUs to reserve EUs in the chip;
detecting a defective EU having a first EU identifier in a "marked" chip, the remaining chips comprising "non-marked" chips;
remapping the defective EU to a selected reserve EU listed in the reserve data structure for the marked chip by updating the remapping data in the remapping data structure for the marked chip, the selected reserve EU having a second EU identifier;
receiving at least one data block for storing to the LLRRM device; and
striping each received data block across the plurality of chips in a non-aligned manner, the striping comprising:
sub-dividing the data block into a plurality of data sub-blocks;
in the marked chip, storing a data sub-block to a page, having a first page identifier, in the selected reserve EU having the second EU identifier; and
in each non-marked chip, storing a data sub-block to a page, having the first page identifier, in an EU having the first EU identifier.

9. The method of claim 8, wherein the predetermined reserve EUs of a chip comprise the first or last X % of EUs of the chip.

10. The method of claim 8, wherein the LLRRM device comprises a permanent storage device or variable capacity device.

11. The method of claim 8, further comprising removing the selected reserve EU from the reserve data structure for the marked chip.

12. The method of claim 8, wherein:
the received data block is received in a write request comprising a requested EU identifier comprising the first EU identifier and a requested page identifier comprising the first page identifier.

13. The method of claim 12, further comprising:
prior to storing a data sub-block to the marked chip, examining the remapping data structure for the marked chip to determine that the requested EU has been remapped to the selected reserve EU; and
prior to storing a data sub-block to a non-marked chip, examining the remapping data structure for the non-marked chip to determine that the requested EU has not been remapped to a reserve EU.

14. The method of claim 8, further comprising:
receiving a read request for the data block, the read request comprising a requested EU identifier comprising the first EU identifier and a requested page identifier comprising the first page identifier; and reading the data block from the plurality of chips in a non-aligned manner, the reading comprising:
in the marked chip, reading a data sub-block from the page, having the first page identifier, in the selected reserve EU having the second EU identifier; and
in each non-marked chip, reading a data sub-block from the page, having the first page identifier, in the EU having the first EU identifier.

15. A storage system for storing data on a low-latency random read memory (LLRRM) device, the storage system comprising:
the LLRRM device comprising a plurality of memory chips being simultaneously accessible for accessing data on the chips, each chip comprising a plurality of erase units, each erase unit (EU) having an EU identifier and comprising a plurality of pages for storing data, each page having a page identifier; and
a storage operating system engine configured for:
maintaining, for each chip, a reserve data structure for listing reserve EUs in the chip;
detecting a defective EU having a first EU identifier in a "marked" chip, the remaining chips comprising "non-marked" chips;
determining whether the marked chip has at least one reserve EU listed in the reserve data structure for the marked chip;
upon determining that the marked chip does not have at least one reserve EU, adding the first EU identifier to the reserve data structure for each non-marked chip;
upon determining that the marked chip has at least one reserve EU, remapping the defective EU to a selected reserve EU listed in the reserve data structure for the marked chip, the selected reserve EU having a second EU identifier;
receiving at least one data block for storing to the LLRRM device;
in the marked chip, storing a data sub-block of the received data block to a page, having a first page identifier, in the selected reserve EU having the second EU identifier; and
in each non-marked chip, storing a data sub-block of the received data block to a page, having the first page identifier, in an EU having the first EU identifier.

16. The storage system of claim 15, wherein the storage operating system engine is further configured for repeatedly detecting, determining, and adding to dynamically add reserve EUs to the reserve data structures for the chips during operation of the LLRRM device.

17. The storage system of claim 15, wherein the storage operating system engine is further configured for removing the selected reserve EU from the reserve data structure for the marked chip.

18. The storage system of claim 15, wherein the LLRRM device comprises a variable capacity device.

19. A method for storing data on a low-latency random read memory (LLRRM) device comprising a plurality of memory chips being simultaneously accessible for accessing data on the chips, each chip comprising a plurality of erase units, each erase unit (EU) having an EU identifier and comprising a plurality of pages for storing data, each page having a page identifier, the method comprising:
maintaining, for each chip, a reserve data structure for listing reserve EUs in the chip;

detecting a defective EU having a first EU identifier in a "marked" chip, the remaining chips comprising "non-marked" chips;

determining whether the marked chip has at least one reserve EU listed in the reserve data structure for the marked chip;

upon determining that the marked chip does not have at least one reserve EU, adding the first EU identifier to the reserve data structure for each non-marked chip;

upon determining that the marked chip has at least one reserve EU, remapping the defective EU to a selected reserve EU listed in the reserve data structure for the marked chip, the selected reserve EU having a second EU identifier;

receiving at least one data block for storing to the LLRRM device;

in the marked chip, storing a data sub-block of the received data block to a page, having a first page identifier, in the selected reserve EU having the second EU identifier; and in each non-marked chip, storing a data sub-block of the received data block to a page, having the first page identifier, in an EU having the first EU identifier.

20. The method of claim 19, further comprising repeatedly detecting, determining, and adding to dynamically add reserve EUs to the reserve data structures for the chips during operation of the LLRRM device.

21. The method of claim 19, wherein further comprising removing the selected reserve EU from the reserve data structure for the marked chip.

22. The method of claim 19, wherein the LLRRM device comprises a variable capacity device.

* * * * *